United States Patent
Kalio et al.

(10) Patent No.: US 12,464,853 B2
(45) Date of Patent: Nov. 4, 2025

(54) SOLAR MODULE WITH PATTERNED COVER PLATE AND OPTICAL INTERFERENCE LAYER

(71) Applicant: CNBM RESEARCH INSTITUTE FOR ADVANCED GLASS MATERIALS GROUP CO., LTD., Bengbu (CN)

(72) Inventors: Rene Kalio, Leipzig (DE); Joerg Palm, Munich (DE); Jens Kullmann, Jessen (DE); Manuel Dias, Wiesbaden (DE); Sven Ring, Berlin (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 125 days.

(21) Appl. No.: 17/262,686

(22) PCT Filed: Jul. 16, 2019

(86) PCT No.: PCT/CN2019/096163
§ 371 (c)(1),
(2) Date: Jan. 22, 2021

(87) PCT Pub. No.: WO2020/020015
PCT Pub. Date: Jan. 30, 2020

(65) Prior Publication Data
US 2021/0313480 A1    Oct. 7, 2021

(30) Foreign Application Priority Data
Jul. 27, 2018   (EP) ..................................... 18186153

(51) Int. Cl.
*H10F 77/42*       (2025.01)
*H02S 20/22*       (2014.01)
*H10F 77/30*       (2025.01)

(52) U.S. Cl.
CPC .......... *H10F 77/484* (2025.01); *H02S 20/22* (2014.12); *H10F 77/315* (2025.01); *H10F 77/488* (2025.01)

(58) Field of Classification Search
CPC ............... H01L 31/054; H01L 31/0547; H01L 31/0543; H01L 31/0232; H01L 31/02327;
(Continued)

(56) References Cited

U.S. PATENT DOCUMENTS 6,384,318 B1 *   5/2002   Nomura ................. H01L 31/048
                                                                  136/246
2007/0188871 A1   8/2007  Fleury et al.
(Continued)

FOREIGN PATENT DOCUMENTS

CN         1867522 A     11/2006
CN       101246924 A      8/2008
(Continued)

OTHER PUBLICATIONS

English machine translation of Schiavoni et al. (WO 2011/006957) published Jan. 20, 2011.*
(Continued)

*Primary Examiner* — Christina Chern
(74) *Attorney, Agent, or Firm* — Bayramoglu Law Offices LLC

(57) ABSTRACT

A solar module having on the front a cover plate with an outer surface and an inner surface is described. The outer surface has a patterned region, on which an optical interference layer for reflecting light within a predefined wavelength range is arranged. The patterned region has a height
(Continued)

Figure 1:
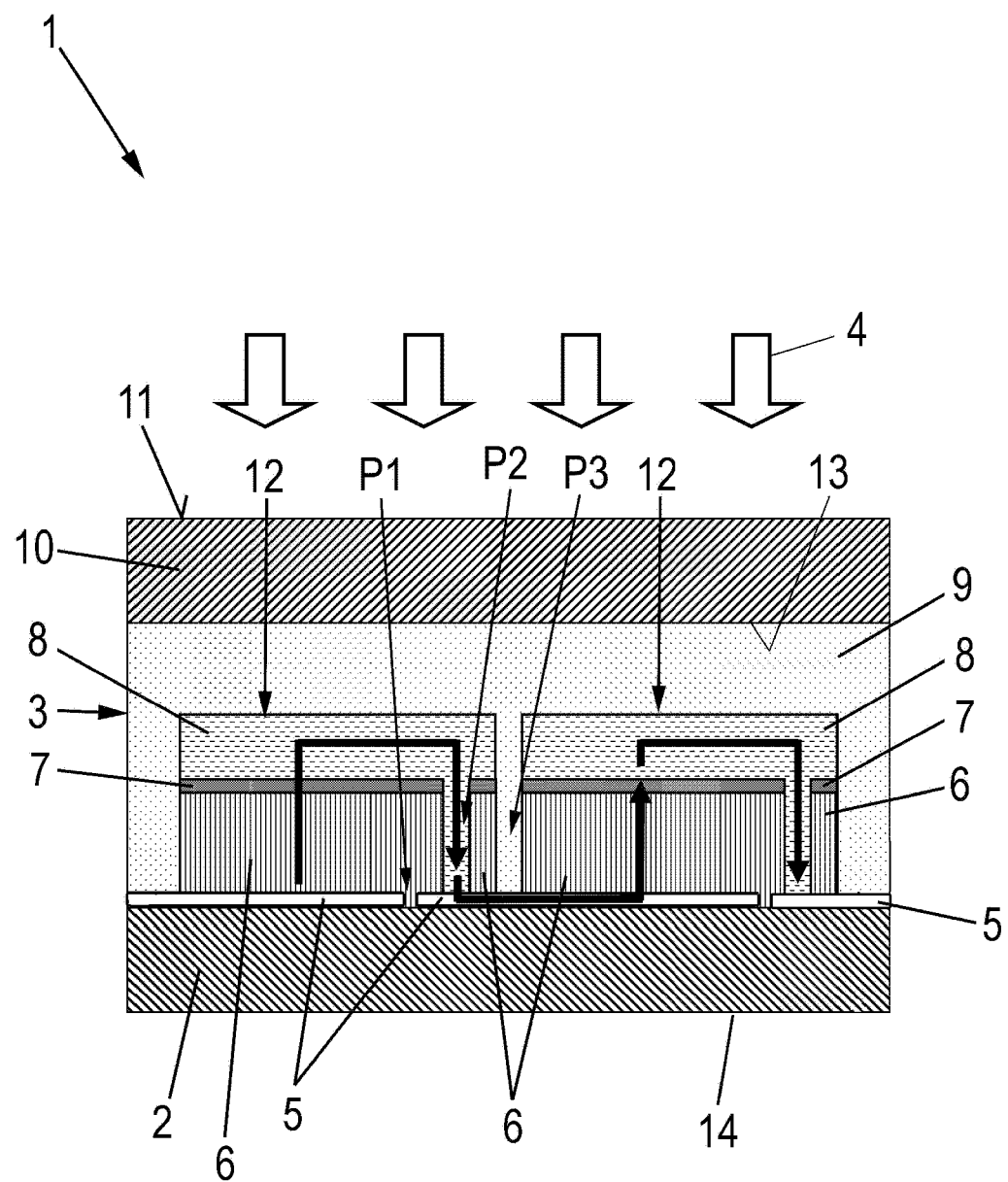

profile with hills and valleys, and a portion of the patterned region is composed of flat segments that are inclined relative to a plane of the cover plate.

16 Claims, 17 Drawing Sheets

(58) Field of Classification Search
CPC ........... H01L 31/0236; H01L 31/02366; H10F 77/484; H10F 77/42; H10F 77/707; H02S 40/22
See application file for complete search history.

(56) References Cited

U.S. PATENT DOCUMENTS

| | | | |
|---|---|---|---|
| 2007/0223095 | A1 | 9/2007 | Brown |
| 2009/0095341 | A1* | 4/2009 | Pfenninger ........... H01L 31/055 136/246 |
| 2009/0229655 | A1 | 9/2009 | Lee |
| 2010/0060987 | A1 | 3/2010 | Witzman et al. |
| 2010/0181014 | A1 | 7/2010 | Raymond et al. |
| 2010/0199577 | A1 | 8/2010 | Sonneveld |
| 2012/0183734 | A1* | 7/2012 | Schiavoni ......... H01L 31/03923 264/319 |
| 2013/0247959 | A1 | 9/2013 | Kwon et al. |
| 2017/0236962 | A1 | 8/2017 | Beleznay et al. |
| 2018/0130921 | A1* | 5/2018 | Mayer ............... H01L 31/02168 |
| 2019/0235304 | A1* | 8/2019 | Tamada .................. G02B 5/00 |

FOREIGN PATENT DOCUMENTS

| | | | | | |
|---|---|---|---|---|---|
| CN | 101339961 | A | | 1/2009 | |
| CN | 101666886 | A | | 3/2010 | |
| CN | 101811386 | A | | 8/2010 | |
| CN | 102356473 | A | | 2/2012 | |
| CN | 102403380 | A | | 4/2012 | |
| CN | 202487586 | U | | 10/2012 | |
| CN | 203603404 | U | | 5/2014 | |
| CN | 104395081 | A | | 3/2015 | |
| CN | 205573193 | U | | 9/2016 | |
| CN | 103325871 | B | | 12/2016 | |
| EP | 0404282 | A1 | | 12/1990 | |
| EP | 2806464 | A1 | * | 11/2014 | ....... H01L 31/02165 |
| EP | 3599318 | A1 | | 1/2020 | |
| EP | 3599649 | A1 | | 1/2020 | |
| JP | H11243225 | A | * | 9/1999 | ........... H01L 31/042 |
| JP | 2002106151 | A | | 4/2002 | |
| WO | WO-2011006957 | A2 | * | 1/2011 | ......... H01L 31/0236 |
| WO | 2011/143015 | A1 | | 11/2011 | |
| WO | WO2011136177 | A1 | * | 11/2011 | ........... H01L 31/042 |
| WO | 2013/158581 | A1 | | 10/2013 | |
| WO | 2014/045142 | A1 | | 3/2014 | |
| WO | 2016/020797 | A2 | | 2/2016 | |
| WO | WO-2018158470 | A2 | * | 9/2018 | ............ B32B 17/04 |
| WO | 2020/020016 | A1 | | 1/2020 | |
| WO | 2020/020019 | A1 | | 1/2020 | |

OTHER PUBLICATIONS

English machine translation of Orita et al. (WO 2011/136177) published Nov. 3, 2011.*
JNS glass & coatings, retrieved from https://jnsglass.com/low-iron-glass/ on Jan. 14, 2023.*
Polymer Properties Database retrieved from https://polymerdatabase.com/polymer%20physics/Ref%20Index%20Table%20.html on Mar. 5, 2019.*
English machine translation of Uematsu et al. (JP H11243225) published Sep. 7, 1999.*
International Search Report and Written Opinion for International Application No. PCT/CN2019/096163 filed on Jul. 16, 2019 on behalf of CNBM Bengbu Design & Res Institute for Glass Industry Co Ltd. Mail Date: Oct. 14, 2019. 8 Pages.
International Search Report and Written Opinion for International Application No. PCT/CN2019/096167 filed on Jul. 16, 2019 on behalf of CNBM Bengbu Design & Res Institute for Glass Industry Co Ltd. Mail Date: Oct. 16, 2019. 10 Pages.
International Search Report and Written Opinion for International Application No. PCT/CN2019/096226 filed on Jul. 16, 2019 on behalf of CNBM Bengbu Design & Res Institute for Glass Industry Co Ltd. Mail Date: Sep. 26, 2019. 4 Pages.

* cited by examiner

SOLAR MODULE WITH PATTERNED COVER PLATE AND OPTICAL INTERFERENCE LAYER

CROSS-REFERENCE TO RELATED APPLICATIONS

The present application is the U.S. National Stage of International Patent Application No. PCT/CN2019/096163 filed on Jul. 16, 2019 which, in turn, claims priority to European Patent Application No. EP 18186153.5 filed on Jul. 27, 2018.

The present invention is in the technical area of photovoltaic energy generation and relates to a solar module with a patterned cover plate and at least one optical interference layer. The invention further extends to a method for producing the solar module according to the invention as well as use thereof.

The use of solar modules as wall or façade elements is currently a market that is still economically relatively small but very interesting ecologically. In particular, in light of intensified efforts for decentralized energy solutions and energy neutral buildings, the demand for the use of solar modules as integrated components of building envelopes is increasing. Other interesting areas of application for solar modules are noise abatement walls (roadway, railway), privacy barriers in the outdoors, or walls for greenhouses. These new applications make completely new demands on solar modules, in particular in terms of aesthetics, service life, and other functionalities such as sealing and thermal insulation. In particular, the solar modules used for this would have to be available in various shapes, sizes, and colors and give the most homogeneous color impression possible. Depending on the origin of the color (absorption/re-emission, interference, refraction), the color of a per se homogeneous surface of the solar module can depend on the viewing angle and/or angle of incidence. Moreover, the spectrum and the physical distribution (diffuse, focused) of the light also determine the color impression.

These new applications make completely new demands on solar modules, in particular in terms of aesthetics, service life, and other functionalities such as sealing and thermal insulation. In particular, the solar modules used for this would have to be available in various shapes, sizes, and colors and give the most homogeneous color impression possible. However, these demands on the solar modules cause technical problems that are in conflict with the actual functionality of the solar modules, namely the most efficient possible generation of electrical power from sunlight.

An ideal solar module, in terms of efficiency optimization, would be a black body that completely absorbs the incident light in order to optimally convert the radiant energy into electrical energy. However, incident radiation is reflected from every actual body and absorbed radiation is re-emitted, with the color impression basically created in the human eye by the spectrally selected reflection and the re-emission of light. The solar spectrum has, in the visible spectral range, the highest energy intensity and the human eye has the greatest sensitivity. When a solar module is designed colored, in other words, when a color impression that differs from the ideal black body is intended to be produced in the human eye, the intensity of the light absorbed in the optically active semiconductor and thus the electrical output or the efficiency of the solar module is necessarily reduced. Optimal efficiency can, in principle, be achieved only with a black solar module. On the other hand, depending on the origin of the color (absorption/re-emission, interference, refraction), the color of a per se homogeneous surface of the solar module can depend on the viewing angle and/or angle of incidence. Moreover, the spectrum and the physical distribution (diffuse, focused) of the light also determine the color impression.

In the international patent application WO 2014/045142, multi-ply interference layers on the inner side of a front glass are described, which reflect a defined spectral range of sunlight. Such multi-ply interference layers are quite expensive to produce and thus have only limited suitability for industrial exploitation. Also presented is the optional use of a diffusely scattering cover glass, wherein the multi-ply interference layer and the roughened side of the cover glass are situated on different sides of the cover glass (multi-ply interference layer, inside; roughening, outside).

Also known is the use of bionic methods, wherein nanostructures that are similar to those of butterflies are generated (cf. Fraunhofer, Bläsi et al. 33*rd European PV Solar Energy Conference and Exhibition,* 24-29 Sep. 2017, Amsterdam, The Netherlands). These methods are quite complicated and cost intensive and are not yet suitable for industrial series production of large area solar modules.

Further known is the application of colors on cover glazings by ceramic screen printing or the use of organic glass colors. These are comparatively inexpensive technologies which can also generate a broad spectrum of colors. In addition, the color impression is angle-dependent only to a limited extent. However, color layers as such are, in principle, opaque and light absorbing such that the efficiency loss is unavoidably high. This is true in particular for light tones, which generally result in an unacceptable efficiency loss.

In contrast, the object of the present invention consists in making available a colored solar module, wherein the color should depend as little as possible on the viewing angle and the angle of incidence since, otherwise, with use in the building-integrated sphere, the color would strongly depend on the location of the viewer or the position of the sun. Additionally, for each color desired by the customer, the efficiency loss of the solar module should be as little as possible. For industrial series production, it is also important that the solar modules be producible on large areas as well as at acceptable costs and with satisfactory homogeneity.

These and other objects are accomplished according to the proposal of the invention by a solar module and a method for its production according to the coordinate claims. Advantageous embodiments of the invention are indicated by the features of the dependent claims.

Presented according to the invention is a solar module with solar cells electrically connected in series for photovoltaic energy generation. In principle, the solar module according to the invention can be any type of solar module, in particular, a wafer-based, silicon-based solar module or a thin-film solar module with monolithically integrated series-connected solar cells.

Preferably, the solar module according to the invention is a thin-film solar module. Advantageously, the solar module is a thin-film solar module with a composite pane structure that has a front transparent cover plate and a back substrate (e.g., glass plates) that are fixedly bonded to one another by a thermoplastic or cross-linking polymer intermediate layer (e.g., PVB or EVA). The invention refers, in particular, to a thin-film solar module in substrate configuration, wherein the layer structure for producing the solar cells is applied on a surface of the back substrate facing the light-entry side. The invention equally refers to a thin-film solar module in superstrate configuration, wherein the layer structure is applied on a surface of a front transparent cover plate facing away from the light-entry side.

In keeping with the customary usage, the term "thin-film solar module" refers to modules having a layer structure with a low thickness of, for example, a few microns, which require a carrier for adequate mechanical stability. The carrier can be made, for example, of inorganic glass, plastic, metal, or a metal alloy and can be designed, depending on the respective layer thickness and the specific material properties, as a rigid plate or a flexible film.

In the case of a thin-film solar module, the layer structure comprises, in a manner known per se, a back electrode layer, a front electrode layer, and a photovoltaically active absorber layer arranged between the back electrode layer and the front electrode layer. The front electrode layer is optically transparent since passage of light to the layer structure must be enabled. The optically transparent front electrode layer typically includes or is made of a doped metal oxide (TCO=transparent conductive oxide), for example, n-conductive, in particular aluminum-doped, zinc oxide (AZO).

The photovoltaically active absorber layer preferably includes or is made of a chalcopyrite semiconductor, advantageously a ternary I-III-VI-compound semiconductor from the group copper indium/gallium disulfide/diselenide (Cu(In,Ga)(S,Se)$_2$). In the above formula, indium and gallium each can be present alone or in combination. The same is true for sulfur and selenium, each of which can be present alone or in combination. Particularly suitable as material for the absorber layer is CIS (copper indium diselenide/disulfide) or CIGS (copper indium gallium diselenide, copper indium gallium disulfide, copper indium gallium disulfoselenide). The absorber layer typically has doping of a first conductor type (charge carrier type) and the front electrode has doping of the opposite conductor type. Generally speaking, the absorber layer is p-conductive (p-doped), i.e., has an excess of defect electrons (holes), and the front electrode layer is n-conductive (n-doped) such that free electrons are present in excess. A buffer layer is typically arranged between the absorber layer and the front electrode layer. This is true in particular for absorber layers based on Cu(In,Ga)(S,Se)$_2$, with which, generally speaking, a buffer layer is required between a p-conductive Cu(In,Ga)(S,Se)$_2$ absorber layer and an n-conductive front electrode. According to current understanding, the buffer layer enables electronic matching between the absorber and the front electrode. Moreover, it offers protection against sputtering damage in a subsequent process step of deposition of the front electrode, for example, by DC magnetron sputtering. By means of the succession of an n-conductive front electrode layer, a buffer layer, and a p-conductive absorber layer, a p-n-heterojunction is formed, in other words, a junction between layers of the opposite conductor type. The photovoltaically active absorber layer can also be made, for example, of cadmium telluride (CdTe) or amorphous and/or microcrystalline silicon.

In the thin-film solar module, serially connected solar cells are formed by patterning zones. Thus, at least the back electrode layer is subdivided by first patterning lines (P1-lines) into sections completely separated from one another, which sections form the back electrodes of the solar cells. Also, at least the absorber layer is subdivided by second patterning lines (P2-lines) into sections completely separated from one another, which sections form the absorbers of the solar cells, and at least the front electrode layer is subdivided by third patterning lines (P3-lines) into sections completely separated from one another, which sections form the front electrodes of the solar cells. Adjacent solar cells are electrically connected to one another in serial connection via electrically conductive material in the second patterning lines, wherein the front electrode of one solar cell is electrically connected to the back electrode of the adjacent solar cell and, typically, but not mandatorily, makes direct physical contact therewith. Each patterning zone comprises a direct succession of the three patterning lines P1-P2-P3, in this order in each case.

In keeping with the customary usage, the term "solar cell" refers to a region of the layer structure that has a front electrode, a photovoltaically active absorber, and a back electrode and is delimited by two patterning zones directly adjacent one another. This applies analogously in the edge region of the module, wherein, instead of a patterning zone, there is a connection section for electrically contacting the serial connection of the solar cells such that the solar cell is defined by the layer region with a front electrode, an absorber, and a back electrode, which is situated between a patterning zone and the directly adjacent connection section. Each solar cell has an optically active zone that comprises, arranged one atop another in the form of a stack, a back electrode, an absorber, and a front electrode and is capable of photoelectric conversion of light into electric current.

The solar module according to the invention comprises a light-entry-side or front transparent cover plate, which has an outer surface facing the external environment and an inner surface opposite the outer surface. The outer surface of the cover plate, in the installed state of the façade element in the façade, faces the external environment and forms, optionally with layers applied thereon, part of the outer side or outer surface of the façade. According to one embodiment of the invention, the cover plate is made of one and the same material, for example, glass or plastic, preferably soda lime glass. Preferably, the cover plate is a rigid glass or plastic plate. The outer surface or inner surface of the cover plate is, in this case, formed from the respective material of the cover plate. According to an alternative embodiment of the invention, the cover plate is made of at least two different materials, with the outer surface and/or the inner surface of the cover plate formed from a material different from a core of the cover plate. The core of the cover plate is preferably made of one and the same material, for example, glass or plastic, preferably soda lime glass. Applied on the core of the cover plate, on the outside and/or the inside, is a material different from core of the cover plate, which is transparent and has the same optical refractive index as the material of the core of the cover plate. The outer surface or inner surface of the cover plate is, in this case, formed by the respective material that is applied on the core of the cover plate. According to the invention, the term "cover plate" also includes "composite body", provided that the materials that form the cover plate are transparent and have one and the same optical refractive index. Preferably, the cover plate has no curvature and is thus planar (flat). The cover plate can, however, also be curved. The cover plate can be rigid or flexible. In the form of a flexible cover plate, it can be provided in planar form.

A flat (planar) cover plate defines a plane, which, in the context of the present invention, means "plane of the cover plate". In the case of a curved cover plate, a local plane, which also means "plane of the cover plate", can be defined by an (imaginary) flat tangential surface at any point of the plane.

In the context of the present invention, the term "transparency" or "transparent" refers to visible-light transmittance of at least 85%, in particular at least 90%, preferably at least 95%, in particular 100%. Typically, visible-light is in the wavelength range from 380 nm to 780 nm. The term "opacity" or "opaque" refers to visible-light transmittance of less than 5%, in particular 0%. The percentage data refer to the intensity of the light measured on the module-interior side of the front cover plate, based on the intensity of the light striking the front cover plate from the external surroundings. The transparency of the cover plate can be determined in a simple manner using a measurement arrangement, wherein, for example, a white light source (source for visible light) is arranged on one side of the front cover plate and a detector for visible light is arranged on the other side of the front cover plate. The following values mentioned for the optical refractive index always refer to the optical refractive index in the visible wavelength range from 380 nm to 780 nm.

The solar module according to the invention gives the viewer, during illumination from the module outer side with white light, in particular during illumination with sunlight, a homogeneous color impression in at least one module section, in other words, the solar module is colored in the module section. Solar modules with homogeneous color impression on the entire surface are considered particularly attractive. The color of the solar module can be described by three color coordinates L*, a*, b*, wherein the color coordinates refer to the (CIE) L*a*b* color space known per se to the person skilled in the art, in which all perceivable colors are defined exactly. This color space is specified in the European Standard EN ISO 11664-4 "Colorimetry-Part 4: CIE 1976 L*a*b* Colour Space", to which reference is made in its entirety within the present invention specification. In the (CIE) L*a*b* color space, each color is defined by a color location with the three Cartesian coordinates L*, a*, b*. Green and red are opposite one another on the a*-axis; the b*-axis runs between blue and yellow; the L*-axis describes the brightness (luminance) of the color. For a clearer representation, the values can be converted into the Lhc color space, wherein L remains the same and the saturation of the radius and h is the angle of a color point in the a*b* plane.

The color of the solar module is based on observation of the solar module from the external environment, in other words, in viewing the front cover plate. The colorimetry or the determination of the color coordinates of the solar module can be done in a simple manner by a commercially available colorimeter (spectrophotometer). For this purpose, the spectrophotometer is pointed at the outer surface of the front cover plate, in particular placed on the outer surface. Common spectrophotometers enable standard-compliant colorimetry, with their structure and tolerances typically subject to international standards, for example, defined by DIN 5033, ISO/CIE 10527, ISO 7724, and ASTM E1347. By way of example, reference is made with regard to colorimetry to the standard DIN 5033 in its entirety. A spectrophotometer has, for example, as a light source, a xenon flash lamp, a tungsten halogen lamp, or one or a plurality of LEDs, with which the outer surface of a body is illuminated with the light (e.g., white light) generated and light received from the solar module is measured. As explained in the introduction, the body color measured by the colorimeter results from the light reflected and re-emitted by the solar module.

In order to ensure that the solar module according to the invention has, at least in one section, a homogeneous color with relatively little angular dependence, the outer surface of the transparent cover plate has at least one patterned region, on which is arranged a coloring (transparent) optical interference layer for reflecting light within a predefined or pre-definable wavelength range. The optical interference layer ist preferably arranged directly (without another intermediate layer) on the outer surface of the cover plate. The optical interference layer can be implemented single-ply or multi-ply, in other words, have one or a plurality of light-refracting plies (refraction layers).

The optical interference layer serves to generate the color of the solar module, with the optical interference layer implemented such that a constructive or destructive interference of light that is reflected on the various interfaces of the optical interference layer is possible. The color of the solar module results from the interference of the light reflected on the interfaces of the optical interference layer. Upon illumination with (white) light, in particular sunlight, the optical interference layer acts as a color filter to produce a homogeneous color. The photovoltaically active solar cells, which have, for example, a bluish-black coloration (CIGS thin-film solar cells), contribute to the overall color of the solar module.

Preferably, the patterned region of the outer surface extends over the entire cover plate, i.e., over the entire outer surface of the cover plate, such that the solar module has a homogeneous color. The solar module can also have multiple module sections each with homogeneous color. The colors of the module sections can be the same or different from one another.

The at least one patterned region has, perpendicular to the plane of the cover plate, a height profile with hills (elevations) and valleys (depressions), wherein a mean height difference between the hills and valleys is at least 2 µm and, preferably, but not mandatorily, is a maximum of 20% of a thickness of the transparent cover plate. Also, at least 50% of the patterned region of the outer surface is composed of differently inclined segments or facets (reflecting regions of the surfaces). The segments are sections of the surface of the cover plate directed toward the external environment and are implemented in each case as planar surfaces that are inclined relative to the plane of the cover plate. Here, at least 20% of the segments have, with reference to the plane of the cover plate, an inclination angle in the range from greater than 0° to a maximum of 15°, and at least 30% of the segments have an inclination angle in the range from greater than 15° to a maximum of 45°. Advantageously, but not mandatorily, less than 30% of the segments have an inclination angle greater than 45°. The patterns are preferably not periodic and anisotropic. However, for special optical effects, periodic patterns and anisotropic patterns can also be used. Also, the segments are in each case flat (planar) and have a segment area of at least 1 µm². The patterned region can, for example, be produced by etching, sandblasting, or rolling of the cover plate.

Accordingly, the patterned region has a plurality of flat (planar) segments. In the context of the present invention, flat (planar) segments can be formed by non-curved surfaces. It is, however, also possible for flat (planar) segments to be formed by slightly curved surfaces. In the context of the present invention, a segment is slightly curved when the following is true for each point of the segment: if, at a point of the segment, an (imaginary) tangential plane with an area of 1 µm² is constructed, the distance between the surface of the segment and the tangential plane based on the normal direction relative to the tangential plane is less than 50 nm.

It is also true that in at least one zone (i.e., subregion) of the patterned region, the segments have in each case a mean roughness of less than 15% of a layer thickness of the optical interference layer that is applied on the patterned region. If the optical interference layer consists of multiple refraction layers, the segments of the at least one zone have in each case a mean roughness of less than 15% of a layer thickness of the refraction layer with the smallest layer thickness. The zone in which the segments each have a mean roughness of less than 15% of the layer thickness of the optical interference layer can correspond to the patterned region, i.e., the zone and the patterned region are then identical.

In the context of the present invention, the term "patterning" or "patterned region" refers to a region of the outer surface or the inner surface of the cover plate in which the features described in the immediately preceding paragraph are present in combination.

By means of the features of the patterned region, it can advantageously be ensured that upon illumination of the cover plate with light even upon viewing outside the glancing angle (angle of incidence of the incident light corresponds to the angle of reflection of the reflected light, with reference to the plane of the cover plate), light is reflected with relatively high intensity. The reason for this is the differently inclined segments that are present in sufficient number, suitable size, and suitable roughness as well as suitable inclination angles to enable a high intensity of the reflected light even upon viewing outside the glancing angle. There are always enough inclined segments that scatter sufficient intensity in directions outside the glancing angle of the cover plate outward by refraction on the segments with patterning and inward by reflection on the segments with patterning.

As used here and in the following, the term "glancing angle" refers to the normal relative to the plane of the cover plate, in distinction from the "local glancing angle", which refers to the normal relative to the plane of a segment. Glancing angles and local glancing angles can be equal (segment is parallel relative to the plane of the cover plate), but are, generally speaking, different (segment is inclined relative to the plane of the cover plate).

As a result, it can be achieved that the intensity of the light not reflected in the glancing angle (i.e., scattered) is relatively high and in comparison with a reflecting surface without such a patterned region, has only a little angular dependence relative to the incident direction and the viewing direction. By means of the optical interference layer, the light reflected outside the glancing angle can, depending on the refractive index and layer thickness of the optical interference layer, be subjected to a color selection such that the surface of the cover plate has a homogeneous color with relatively little angular dependence.

Advantageously in this regard, the patterned region has a height profile, in which a mean height difference between the hills and valleys is at least 2 µm, preferably at least 10 µm, and particularly preferably at least 15 µm. Such a patterned region can be produced by etching of the cover plate (e.g., cover glass). Equally advantageously in this regard, the patterned region has a height profile, in which a mean height difference between the hills and valleys is at least 50 µm, preferably at least 100 µm. Such a patterned region can be produced by rolling of the cover plate (e.g., cover glass). Accordingly, the invention advantageously extends to a façade element, of which at least one patterned region of the cover plate is produced by etching or rolling, by which means said height profiles can be produced. The patterns can, however, also be produced by applying a transparent and patterned layer on the cover plate. The layer must have the same (or at least a very similar) refractive index as the cover plate. According to the invention, the patterning of a surface of the cover plate should also include applying such a transparent and patterned layer.

Said properties of the patterned region of the cover plate can be determined by conventional measuring devices, such as a microscope, in particular a confocal microscope or stylus profilometer.

Preferably, it is achieved by means of the at least one patterned region of the (uncoated) cover plate of the solar module according to the invention that with viewing angles of 45° and 15° (in each case based on the normal relative to the plane of the cover plate) and an angle of incidence that deviates by 45° (in both directions) from the respective glancing angle, a brightness L of the reflected light of at least 10 occurs. Preferably, a brightness L of the reflected light of at least 15 and more preferably at least 20 occurs. During this measurement, a black cover is mounted on the side of the (uncoated) cover plate facing away from the side to be characterized. A D65 illuminant is used for the measurement and the brightness L is measured with a commercially available multi-angle spectrophotometer (10° aperture angle). The measurement setup is explained in detail below in connection with FIG. 14. In this context, reference is made to the European standard EN ISO 11664-4 in its entirety.

The invention extends accordingly to a solar module for photovoltaic energy generation, which comprises a transparent cover plate with an outer surface facing the external environment and an opposite inner surface, wherein the outer surface has at least one patterned region, on which an optical interference layer for reflecting light within a predefined wavelength range is arranged, wherein the patterned region has the following features:

perpendicular to the plane of the cover plate, a height profile having hills and valleys, wherein a mean height difference between the hills and valleys is at least 2 µm, at least 50% of the patterned region is composed of segments that are inclined relative to the plane of the cover plate, wherein, with reference to the plane of the cover plate, at least 20% of the segments have an inclination angle in the range from greater than 0° to a maximum of 15°, and at least 30% of the segments have an inclination angle in the range from greater than 15° to a maximum of 45°, wherein the segments are in each case flat and have a segment area of at least 1 µm$^2$, wherein the segments have in each case a mean roughness of less than 15% of a layer thickness of the optical interference layer on the outer surface.

Here, it is advantageous for the patterned, uncoated cover plate provided with a black back surface, to be implemented such that with a viewing angle of 45° and 15° (based in each case on the normal relative to the plane of the cover plate) and an angle of incidence that deviates by 45° (in both directions) from the respective glancing angle, a brightness L of the reflected light of at least 10, at least 15, or at least 20 occurs.

The invention equally extends to a solar module for photovoltaic energy generation that comprises a transparent cover plate with an outer surface facing the external environment and an opposite inner surface, wherein the outer surface has at least one patterned region, on which an optical interference layer for reflecting light within a predefined wavelength range is arranged, wherein the uncoated cover plate provided with a black back surface and having at least one patterned region is implemented such that with a viewing angle of 45° and 15° (based in each case on the normal relative to the plane of the cover plate) and an angle of incidence that deviates by 45° from the respective glancing angle (in both directions), a brightness L of the reflected light of at least 10, at least 15 or at least 20 occurs According to the invention, the trade-off described in the introduction between a homogeneous color with little angular dependence and simultaneously high efficiency of the solar module can be quite satisfactorily resolved. On the one hand, as a result of the patterned surface of the cover plate, light with a high intensity and little angular dependence is reflected even outside the glancing angle. On the other, as a result of the filter action of the optical interference layer, it is possible for light to be able to strike the photovoltaically active semiconductor of the solar cells with high intensity such that a large share of the incident light can be converted into electrical current with high efficiency or at least with low efficiency loss of the solar module. In addition, as a result of the coloring optical interference layer, a good homogeneous color impression is achieved. The interference layer acts as a filter with the best possible narrowband reflection and broadband transmittance.

In a preferred embodiment of the solar module according to the invention, the outer surface of the cover plate is provided with at least one patterned region, on which a coloring optical interference layer is arranged. In addition, the inner surface of the cover plate has no patterned region and no optical interference layer. The inner surface is preferably smooth (within the limits of production imprecisions). The optical interference layer is preferably arranged directly on the outer surface of the cover plate (in other words, without an additional intermediate layer).

In another preferred embodiment of the solar module according to the invention, the outer surface of the cover plate is provided with at least one patterned region, on which a coloring optical interference layer is arranged. In addition, the inner surface has no patterned region, with another optical interference layer for reflecting light within a predefined wavelength range arranged on the inner surface of the cover plate. The inner surface is preferably smooth (within the limits of production imprecisions). The above statements concerning the optical interference layer on the outer surface of the cover plate apply analogously for the optical interference layer on the inner surface of the cover plate. The two optical interference layers can be the same or different from one another. In particular, the two optical interference layers for reflecting light are implemented within one and the same wavelength range. However, it is also possible for the two optical interference layers for reflecting light to be implemented within different or only partially overlapping wavelength ranges. The layer thicknesses and refractive indices of the two optical interference layers can be the same or different from one another. By this measure, the color of the solar module can be even better defined. In addition, mixed colors can be generated.

In another preferred embodiment of the solar module according to the invention, the outer surface of the cover plate is provided with at least one patterned region, on which a coloring optical interference layer is arranged. In addition, the inner surface has at least one patterned region, on which an optical interference layer for reflecting light within a predefined wavelength range is arranged. The above statements concerning the patterned region of the outer surface of the cover plate apply analogously for the patterned region of the inner surface of the cover plate. The patterned region of the inner surface and the patterned region of the outer surface can be the same or different from one another. For the additional optical interference layer on the inner surface of the cover plate, the statements in this regard in the immediately preceding embodiment of the solar module apply analogously, wherein the layer thicknesses and refractive indices of the two optical interference layers can be the same or different from one another. Through these measures as well, the color of the solar module can be even better defined. In addition, mixed colors can be generated.

In the solar module according to the invention, as a result of the at least one patterned surface of the cover plate, light with high intensity and little angular dependence is reflected even outside the glancing angle. As a result of the at least one optical interference layer, which acts to give color, a very homogeneous color impression is produced. It is common to all embodiments described above that already when the light strikes the patterned outer surface with an interference layer, a color with high intensity and little angular dependence develops even outside the glancing angle as a result of reflection and interference. The additional interference layer and/or patterning on the inner surface can further strengthen this effect.

In an advantageous embodiment of the solar module according to the invention, at least 80%, particularly preferably at least 90%, of a patterned region of the outer surface or the inner surface (depending on which surface is patterned) is composed of segments inclined relative to the plane of the cover plate. By increasing the number of segments, the intensity of the light reflected by the patterned region of the surface of the cover plate even outside the glancing angle and its angular stability are even further increased.

In another advantageous embodiment of the solar module according to the invention, at least 30% of the segments at least of one patterned region have an inclination angle in the range from greater than 0° to a maximum of 15°; at least 40% of the segments have an inclination angle in the range from greater than 15° to a maximum of 45°, and preferably, but not mandatorily, less than 10% of the segments have an inclination angle greater than 45°. Particularly preferably, at least 40% of the segments have an inclination angle in the range from greater than 0° to a maximum of 15°; at least 50% of the segments have an inclination angle in the range from greater than 15° to a maximum of 45°; and preferably, but not mandatorily, less than 10% of the segments have an inclination angle greater than 45°. If relatively many facets with a small inclination angle of less than 15° are present, substantially only a reflected intensity at a viewing angle near the glancing angle occurs (as in the case of an unpatterned surface), which is undesirable according to the invention. With steeper facets, the angular dependence of the reflected light is reduced; however, with numerous very steep facets (greater than 45°), multiple reflections can increasingly occur, which is disadvantageous since this can result to a greater extent in the coupling of that share of the light whose reflection is desirable in the context of the present invention into the absorber layer. In addition, with many coating methods, it is difficult to ensure conforming coverage with equal layer thickness simultaneously on flat and steep surface segments. The layer thickness of the optical interference layer would thus depend on the inclination angle, again resulting in undesirable angular dependences. Most preferable in this regard is an embodiment in which the segments have in each case an inclination angle that is greater than 0° and is a maximum of 45°. In accordance with the preceding conditions, a very high intensity of reflected light can be achieved even outside the glancing angle with, at the same time, particularly little angular dependence of the intensity.

The patterns are preferably not periodic and anisotropic. However, for specific optical effects, periodic patterns and/or anisotropic patterns can also be used. Periodic and anisotropic patterns such as pyramids, tetragonal or hexagonal honeycomb patterns, or hemispheres can also be produced well with rollers during glass drawing. They can be used for attractive gloss and color effects. When the surface patterns meet the aforementioned conditions, the solar modules in turn present a significantly reduced decrease in chromaticity for angles outside the glancing angle; however, the angle dependencies are then anisotropic relative to the orientation on the module level.

The at least one optical interference layer can include one or a plurality of refraction layers and, in particular, be made thereof. A refraction layer is made of one and the same material (with the same composition) and has in particular a homogeneous (equal) refractive index over the entire layer thickness. When the optical interference layer includes multiple refraction layers, at least two refraction layers are made of a material different from one another and have a different refractive index. Advantageously, at least one refraction layer has a refractive index n greater than 1.7, preferably greater than 2.0, and particularly preferably greater than 2.3. In principle, the greater the refractive index, the lower the angular dependence of the reflected light such that the angular dependence of the color impression can be further reduced.

Advantageously, the optical interference layer contains at least one compound selected from $TiO_x$, $ZrO_x$, SiC, and $Si_3N_4$. When the optical interference layer has two, three, or more plies, the optical interference layer preferably contains at least one compound selected from $MgF_2$, $Al_2O_3$, $SiO_2$, and silicon oxynitride. These are compounds with a relatively low refractive index.

In the solar module according to the invention, due to the combination of a patterned surface with an optical interference layer, which has only a small number of refraction layers (e.g., one to three refraction layers), a good color impression can already be achieved. As a result of the small number of refraction layers, the production of the solar module is simplified and the production costs are reduced.

Advantageously, at least one optical interference layer (in particular all optical interference layers) of the solar module includes exactly one refraction layer (or is made thereof), whose refractive index n is greater than 1.9, preferably greater than 2.3.

Equally advantageously, at least one optical interference layer (in particular all optical interference layers) of the solar module includes exactly two refraction layers (or is made thereof), wherein a first refraction layer with a first refractive index n1 is present on the cover plate with a refractive index nd, and a second refraction layer with a second refractive index n2 is present on the first refraction layer. For the amounts (absolute values) of the differences in the refractive indices: $|n1-nd|>0.3$ and $|n2-n1|>0.3$, and at least one of the refractive indices n1 or n2 is greater than 1.9, preferably greater than 2.3.

Equally advantageously, at least one optical interference layer (in particular all optical interference layers) of the solar module includes exactly three refraction layers (or is made thereof), wherein a first refraction layer with a first refractive index n1 is present on the cover plate with a refractive index nd, a second refraction layer with a second refractive index n2 is present on the first refraction layer, and a third refraction layer with a third refractive index n3 is present on the second refraction layer. For the amounts (absolute values) of the differences in the refractive indices: $|n3-n2|>0.3$ and $|n2-n1|>0.3$, and $|n1-nd|>0.3$. Here, the values of the refractive indices behave alternatingly: either n1>n2 and n3>n2 or n1<n2 and n3<n2. In addition, at least one of the refractive indices n1, n2, or n3 is greater than 1.9, preferably greater than 2.3.

As a result of the optical interference layers with exactly one, exactly two, or exactly three refraction layers, a homogeneous color impression of the solar module can be achieved with simplified production and lower production costs of the solar module. As a result of two-ply or three-ply layers, the color intensity, in other words, brightness and saturation, i.e., the reflection in a specific narrow wave range can be increased. As a result of relatively high refractive indices, the angular dependence is reduced. Interference layers made of layer stacks with more than three layers in combination with the patterned cover plate according to the invention and the embodiments presented also fall within the scope of the invention, but are more complex to produce. With a four-ply layer of refractive layers with alternatingly high and low refractive indices, for example, the bandwidth of the reflected light can be reduced even more with improved transmittance.

In the patterned region of the cover plate, a reflection of the incident light beam occurs with relatively high intensity even outside the glancing angle. The patterned region is, for this purpose, preferably implemented such that there is a reflection haze of more than 50%, particularly preferably more than 90%. The reflection haze can be determined by a commercially available haze meter. According to ASTM D1003, haze is the ratio of the diffuse share of reflected light to the total reflection.

In the solar module according to the invention, at least one zone is provided, in which the segments have a mean roughness of less than 15% of the layer thickness of the optical interference layer on the outer surface, by means of which a constructive or destructive interference of the reflected light is enabled. Advantageously, this zone extends over the entire cover plate. According to one embodiment of the invention, the patterned region has at least one other zone, i.e., (sub-) region, in which the segments have in each case a mean roughness such that interference does not occur on the optical interference layer. For example, the segments have, there, a mean roughness of 50% to 100% of the layer thickness of the interference layer. In these zones, the solar module has no color generated by the optical interference layer.

The invention further relates to a method for producing a solar module according to the invention as is described above. The method according to the invention comprises the following steps for processing the cover plate:

In a first step a), a flat transparent cover plate that has an outer surface that is intended to face the external environment and an opposite inner surface is provided.

Then, a single second step b1), b2), or b3) is selected from among the following three (alternative) steps and carried out:

b1) Patterning the outer surface at least in one region and applying an optical interference layer on the patterned region. In this case, the inner surface is not patterned and no optical interference layer is applied on the inner surface.

b2) Patterning the outer surface at least in one region, applying an optical interference layer on the patterned region of the outer surface, and applying another optical interference layer on the inner surface. In this case, the inner surface is not patterned.

b3) Patterning the outer surface at least in one region, applying an optical interference layer on the patterned region of the outer surface, patterning the inner surface at least in one region, and applying another optical interference layer on the patterned region of the inner surface.

In the above method, the patterning of the outer surface or inner surface also includes applying a transparent layer provided with at least one patterned region on the cover plate, which forms the outer surface or inner surface.

The invention further extends to the use of the solar module according to the invention as a (an integral) component of a building envelope (building wall) or a freestanding wall, for example, a privacy wall or a noise barrier.

The various embodiments of the invention can be realized individually or in any combinations. In particular, the features mentioned above and hereinafter can be used not only in the combinations indicated but also in other combinations or in isolation without departing from the scope of the present invention.

Figure 2:
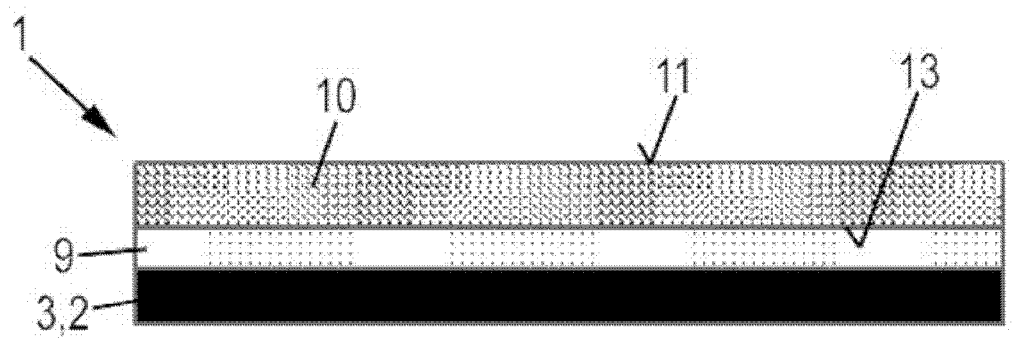
Figure 3:
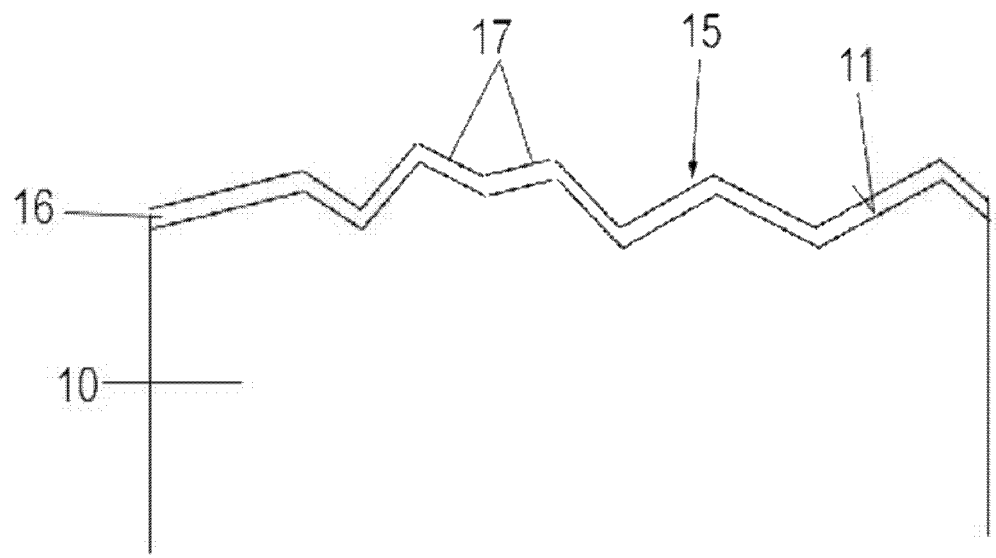
Figure 4:
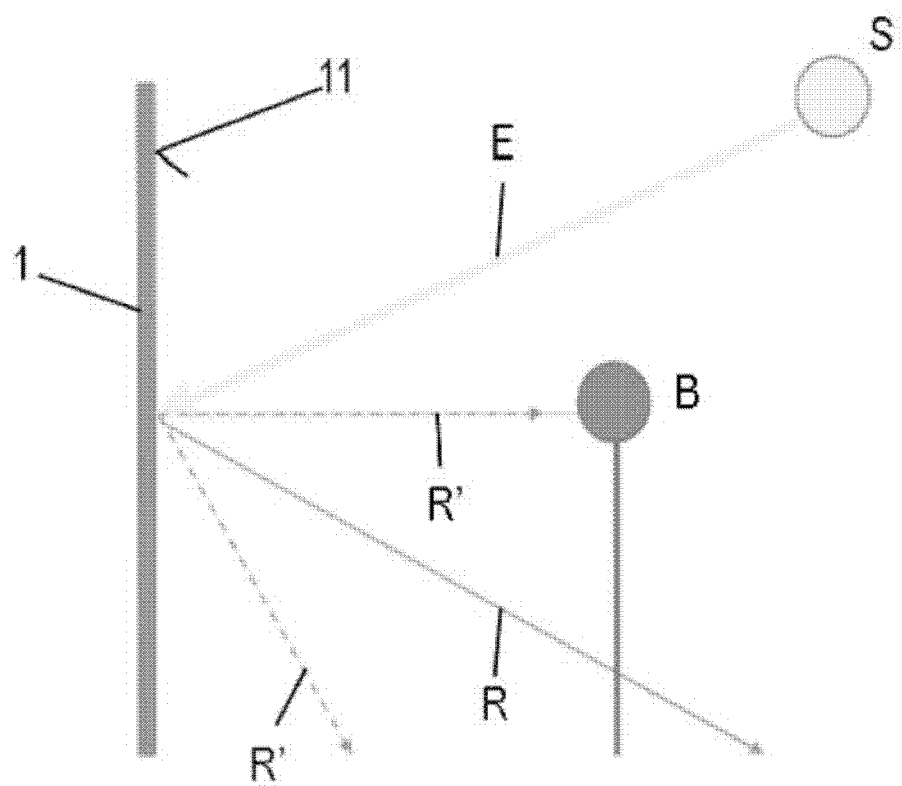
Figure 9:
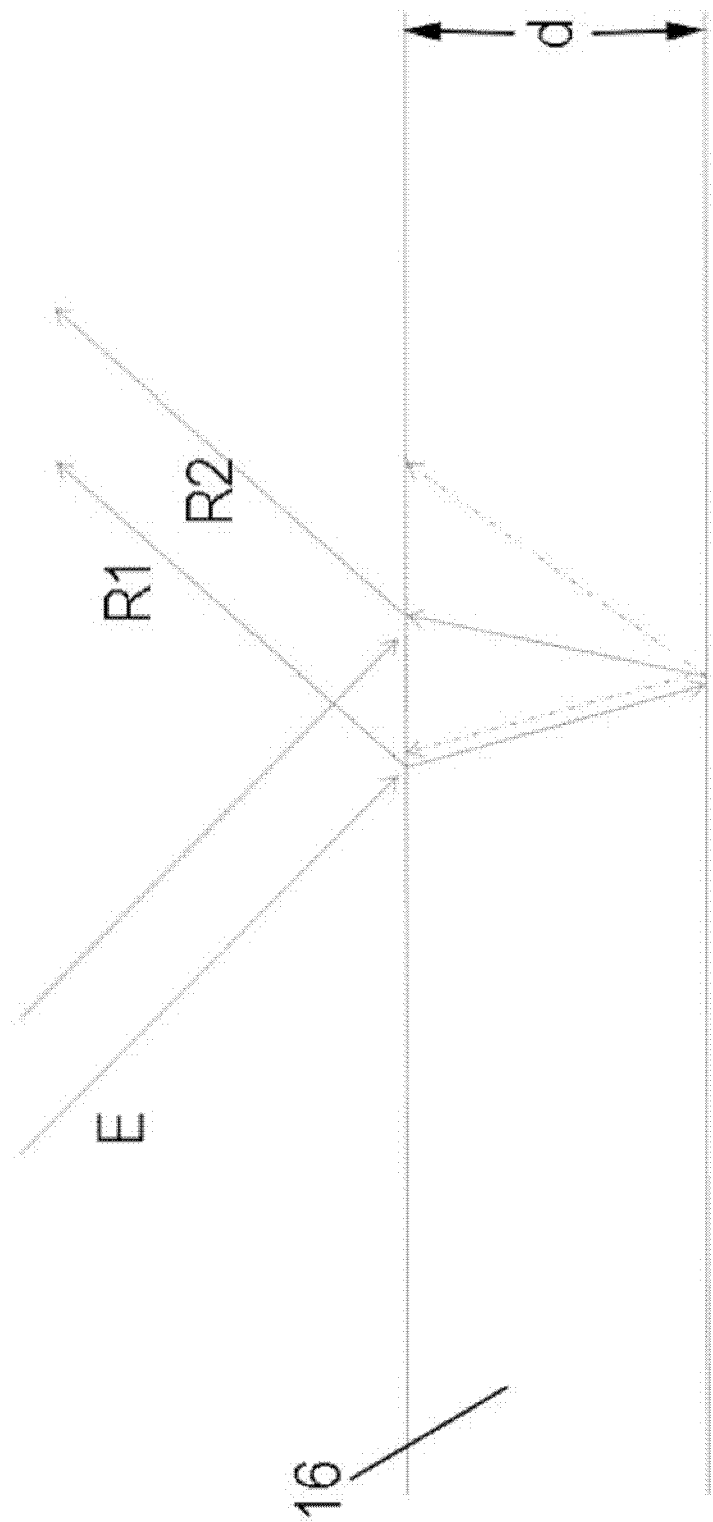
Figure 14:
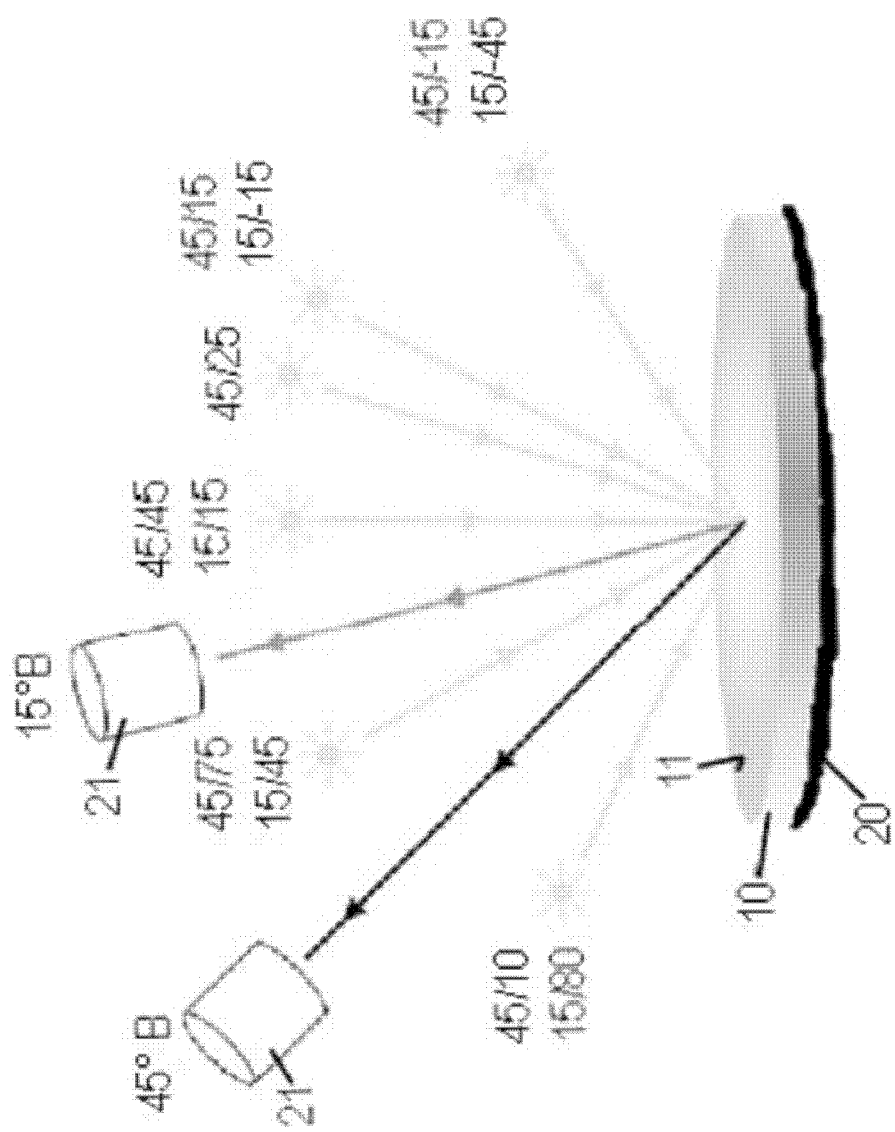
Figure 15:
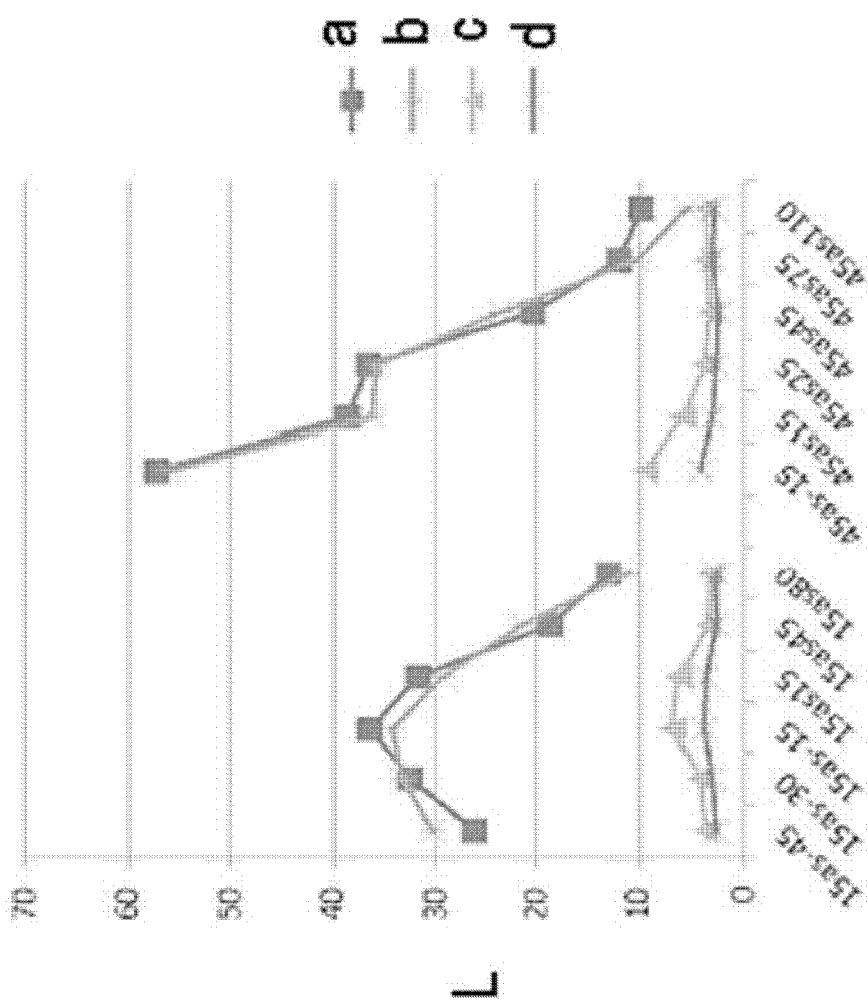
Figure 16:
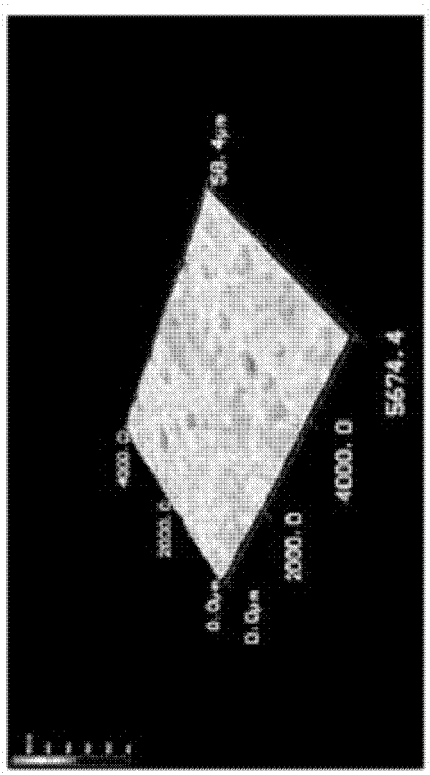
Figure 17:
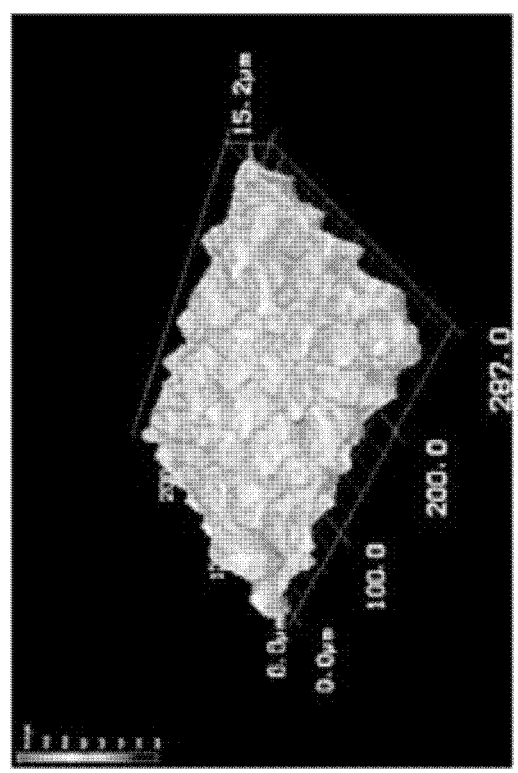
Figure 18:
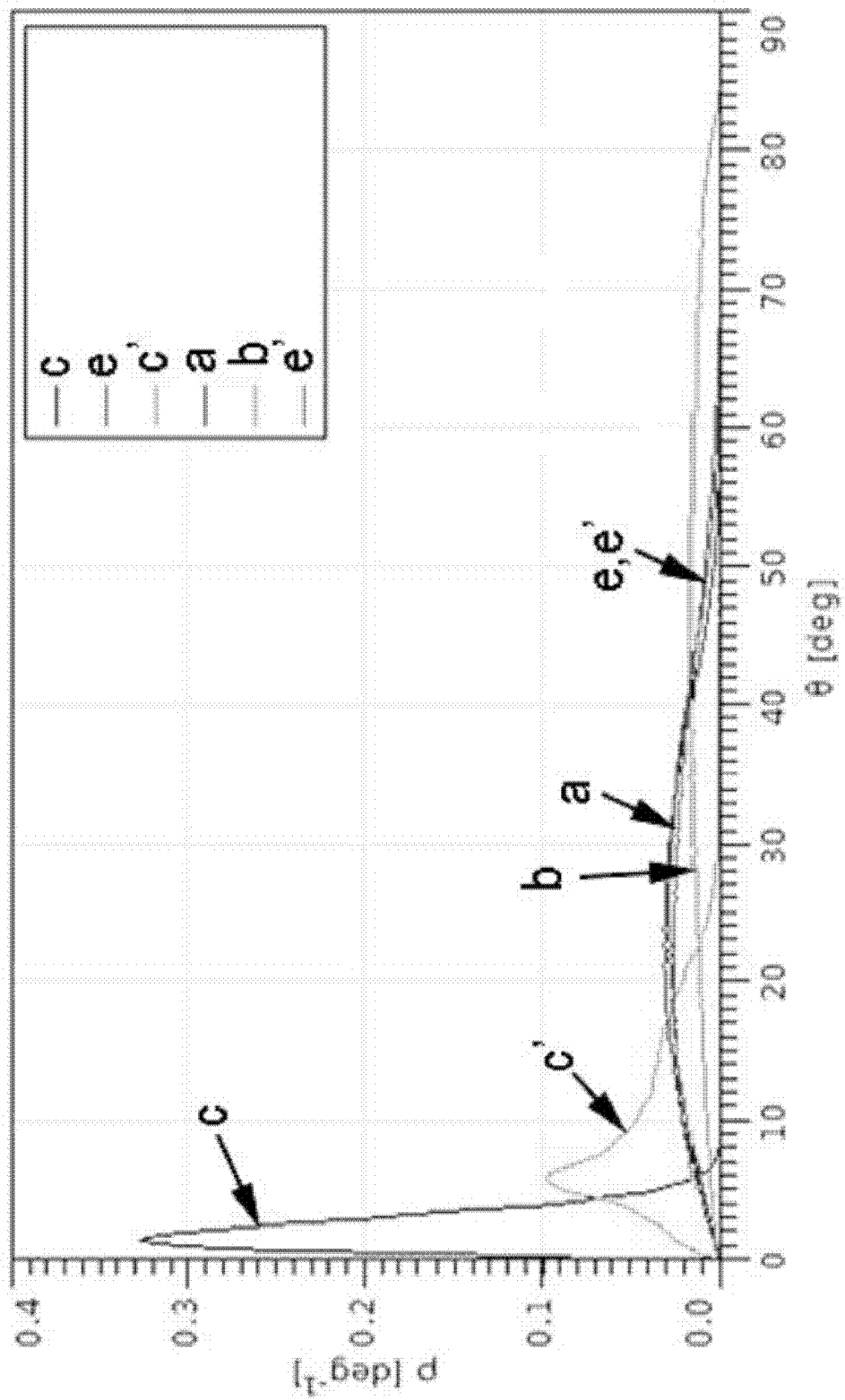
Figure 24:
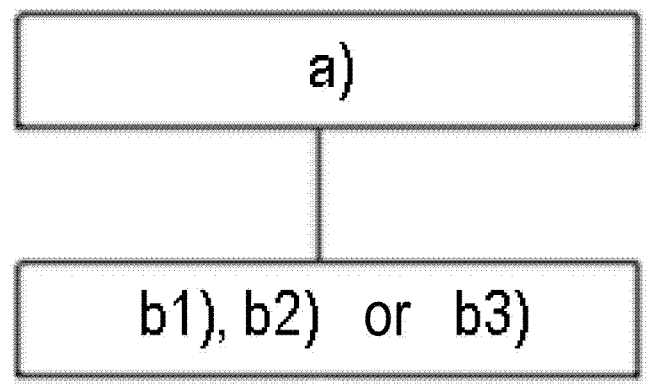

The invention is explained in detail in the following, referring to the accompanying figures. They depict, in simplified, not to scale representation:

FIG. 1 an exemplary embodiment for a solar module according to the invention in a schematic cross-section;

FIG. 2 the basic structure of the solar module according to the invention in schematic cross-section;

FIG. 3 an enlarged detail of the cover plate of the solar module of FIG. 2 in schematic cross-section;

FIG. 4 a schematic representation of typical light relations of a solar module implemented as a façade element;

FIG. 5-8 schematic representations of exemplary light paths in reflection on the cover plate of the solar module of FIG. 2;

FIG. 9 a schematic representation of the interference of light beams in the optical interference layer;

FIG. 10-13 various embodiments of the solar module according to the invention;

FIG. 14 a schematic representation of the measurement method for multi-angle color measurement;

FIG. 15 a diagram for representing the measured values of angle-dependent measurement of the brightness of four different glass panes;

FIG. 16-17 height profiles of various glass panes;

FIG. 18 a diagram for representing the angular distributions of the segments of various glass panes;

FIG. 19-23 diagram for representing various properties of optical interference layers;

FIG. 24 a flowchart for illustrating the method according to the invention.

FIG. 1 schematically illustrates a solar module according to the present invention referenced as a whole with the number 1 using a cross-sectional view (section perpendicular to the module surface). The solar module 1 implemented by way of example in the form of a thin-film solar module comprises a plurality of solar cells 12 serially connected to one another in integrated form, of which, in a greatly simplified manner, only two are depicted. Of course, generally speaking, in the solar module 1, a large number of solar cells 12 (for example, approx. 100-150) are serially connected. The solar module 1 has a composite pane structure in substrate configuration. It comprises a back substrate 2 with a layer structure 3 made of thin films applied thereon, wherein the layer structure 3 is arranged on a light-entry-side surface of the substrate 2. The substrate 2 is implemented here, for example, as a rigid, flat glass plate with relatively high light permeability, wherein other electrically insulating materials with desired stability and inert behavior relative to the process steps carried out can equally be used.

The layer structure 3 includes, arranged on the surface of the substrate 2, an opaque back electrode layer 5 that is made, for example, of a light-impermeable metal such as molybdenum (Mo) and was applied on the substrate 2 by vapor deposition or magnetron enhanced cathodic sputtering (sputtering). The back electrode layer 5 has, for example, a layer thickness in the range from 300 nm to 600 nm. A photovoltaically active (opaque) absorber layer 6 made of a semiconductor doped with metal ions whose band gap is capable of absorbing the greatest possible share of sunlight is applied on the back electrode layer 5. The absorber layer 6 is made, for example, of a p-conductive chalcopyrite semiconductor, for example, a compound of the group $Cu(In/Ga)(S/Se)_2$, in particular sodium (Na)-doped $Cu(In/Ga)(S/Se)_2$. In the above formula, indium (In) and gallium (Ga) as well as sulfur(S) and selenium (Se) can be present optionally or in combination. The absorber layer 6 has a layer thickness that is, for example, in the range from 1-5 μm and is, in particular, approx. 2 μm. For the production of the absorber layer 6, various material layers are typically applied, for example, by sputtering, which layers are subsequently thermally converted to form the compound semiconductor by heating in a furnace, optionally in an atmosphere containing S and/or Se (RTP=rapid thermal processing). This manner of production of a compound semiconductor is well known to the person skilled in the art such that it need not be discussed in detail here. Deposited on the absorber layer 6 is a buffer layer 7, which consists here, for example, of a single layer of cadmium sulfide (CdS) and a single layer of intrinsic zinc oxide (i-ZnO), not depicted in detail in FIG. 1. A front electrode layer 8 is applied on the buffer layer 7, for example, by sputtering. The front electrode layer 8 is transparent to radiation in the visible spectral range ("window electrode") such that the incoming sunlight 4 (symbolized in FIG. 1 by arrows) is weakened only slightly. The front electrode layer 8 is based, for example, on a doped metal oxide, for example, n-conductive aluminum (Al)-doped zinc oxide (ZnO). Such a front electrode layer 8 is generally referred to as a TCO layer (TCO=transparent conductive oxide). The layer thickness of the front electrode layer 8 is, for example, approx. 500 nm. By means of the front electrode layer 8, together with the buffer layer 7 and the absorber layer 6, a heterojunction (in other words, a succession of layers of the opposite conductor type) is formed. The buffer layer 7 can effect electronic matching between the absorber layer 6 and the front electrode layer 8.

For protection against environmental influences, a (plastic) adhesive layer 9, which serves to encapsulate the layer structure 3, is applied on the layer structure 3. Glued with the adhesive layer 9 is a front or light-entry-side cover plate 10 transparent to sunlight, implemented here, for example, in the form of a rigid (planar) glass plate made of extra white glass with low iron content. The cover plate 10 is used for sealing and for mechanical protection of the layer structure 3. The cover plate 10 has an inner surface 13 facing the solar cells 12 and an outer surface 11 facing away from the solar cells 12, which is, at the same time, the module surface or the module upper side. The solar module 1 can absorb sunlight 4 via the outer surface 11 in order to produce electrical voltage on resultant voltage connections (+,−). A current path is depicted in FIG. 1 by arrows arranged in series. The cover plate 10 and the substrate 2 are fixedly bonded to one another ("laminated"), with the adhesive layer 9 implemented here, for example, as a thermoplastic adhesive layer that is plastically deformable by heating and, upon cooling, fixedly bonds the cover plate 10 and the substrate 2 to one another. The adhesive layer 9 can be provided in the production process as a laminating film and, here, is made, for example, of PVB. The cover plate 10 and the substrate 2 with the solar cells 12 embedded in the adhesive layer 9 form, together, a laminated composite. The back of the module 14 is the surface of the substrate 2 facing away from the solar cells 12.

For the formation and serial connection of the solar cells 12, the layer structure 3 is patterned using a suitable patterning technology, for example, laser scribing and/or mechanical ablation. Commonly, for this purpose, direct successions of, in each case, the three patterning lines P1-P2-P3 are introduced into the layer structure 3. Here, at least the back electrode layer 5 is subdivided by first patterning lines P1, producing the back electrodes of the solar cells 12. At least the absorber layer 6 is subdivided by second patterning lines P2, producing the photovoltaically active regions (absorbers) of the solar cells 12. At least the front electrode layer 8 is subdivided by third patterning lines P3, producing the front electrodes of the solar cells 12. By means of the second patterning line P2, the front electrode of one solar cell 12 is electrically connected to the back electrode of an adjacent solar cell 12, with the front electrode, for example, directly contacting the back electrode. In the exemplary embodiment of FIG. 1, the trenches of the first patterning lines P1 are filled by material of the absorber layer 6. The trenches of the second patterning lines P2 are filled by material of the front electrode layer 8, and the trenches of the third patterning lines P3 are filled by the adhesive layer 9. Each direct succession of a first, second, and third patterning line P1-P2-P3 forms a patterning zone for serial connection to directly adjacent solar cells 12. Reference is now made to FIG. 2, wherein the basic structure of the solar module 1 according to the invention is depicted. The solar module 1 comprises the cover plate 10 (e.g., front glass) and the layer structure 3 applied on the back substrate 2, which are fixedly bonded to one another by the adhesive layer 9 (laminating film). The coloring element is the coated cover plate 10, whose outer surface 11 faces the incident light and whose inner surface 13 is connected to the photovoltaic solar cells (silicon wafer or thin-film solar cells) via the adhesive layer 9. The solar module 1 can, in particular, be structured as described in FIG. 1. The cover plate 10 consists here, for example, of a glass pane with the least possible absorption, for example, low-iron soda lime glass. The coloring cover plate 10 is patterned on the outer surface 11 (e.g., by etching, sandblasting, or rolling during the drawing process) and has, on the patterned region, a coating in the form of an optical interference layer, which is not depicted in FIG. 1 and FIG. 2 (cf. FIG. 3).

FIG. 3 depicts an enlarged detail of the cover plate 10 of the solar module 1 of FIG. 1 and FIG. 2 in cross-section. The outer surface 11 of the cover plate 10 is patterned in a region 15, which extends, in the present example, over the entire outer surface 11. An optical interference layer 16 is arranged directly on the outer surface 11. In the patterned region 15, the outer surface 11 is provided with a height profile that has hills and valleys. Here, more than 50% of the outer surface 11 consists of planar segments 17, whose planes are in each case inclined relative to the plane of the cover plate 10, i.e., have a non-zero angle. The segments 17 have in each case a segment area of at least 1 µm$^2$ and a mean roughness of less than 15% of a layer thickness d of the optical interference layer 16. A mean height difference between the highest points (hills) and the lowest points (valleys) of the outer surface 11 is at least 2 µm, and is, for example, a maximum of 20% of the thickness of the transparent cover plate 10. Relative to the plane of the cover plate 10, at least 20% of the segments have an inclination angle in the range from greater than 0° to a maximum of 15°; at least 30% of the segments have an inclination angle in the range from greater than 15° to a maximum of 45°; and less than 30% of the segments 17 have an inclination angle greater than 45°. In the exemplary embodiment of FIG. 3, all segments have an inclination angle of a maximum of 45°. The optical interference layer 16 is thin, with a layer thickness, for example, in the range from 0.1 to 2 µm such that the surface of the thin interference layer 16 follows the hills and valleys of the patterned region 15. The optical interference layer 16 has a refractive index n greater than 1.7, preferably greater than 2.0, and particularly preferably greater than 2.3, as well as the least possible absorption with regard to the incident light. The optical interference layer 16 can be single-ply or multi-ply and can consist of one or a plurality of refraction layers. Each refraction layer has a specific refractive index and is made of the same material. For example, the optical interference layer 16 is made of MgO, SiONx, $Si_3N_4$, $ZrO_2$, TiOx, and/or SiC. The electrical conductivity of the one or more refraction layers should be as low as possible.

In the following, the operating principle of the patterning of the outer surface 11 is described in detail. Consider first FIG. 4, wherein, by way of example, typical light relations with a solar module 1 implemented as a façade element are illustrated. According to it, light from the sun S strikes directly on the outer surface 11 of the solar module 1 and is reflected in the glancing angle (angle of incidence=angle of reflection, relative to the surface normal of the plane of the cover plate). The incident light beam E and the light beam R reflected in the glancing angle are depicted. In addition to the reflected light beam R, the incident light is also scattered diffusely outside the glancing angle. Two diffusely scattered light beams R' are depicted by way of example. The color effect is produced by reflection, scattering, and interference. When a viewer B stands in front of the solar module 1 and looks directly in front of himself at a right angle to the outer surface 11, with direct sunlight, the directly reflected light R strikes his eye only in the rarest of cases (in other words, the viewer is not usually within the glancing angle). This is illustrated in FIG. 4, where the viewer B is situated outside the glancing angle and sees only the diffusely scattered light beam R'. In the case of a smooth surface without patterned region 15, the intensity of the diffusely scattered light R' is low and has strong angular dependence. Only when the diffusely scattered share is adequately large is there a clear color with satisfactory intensity (brightness, L value).

Figure 5:
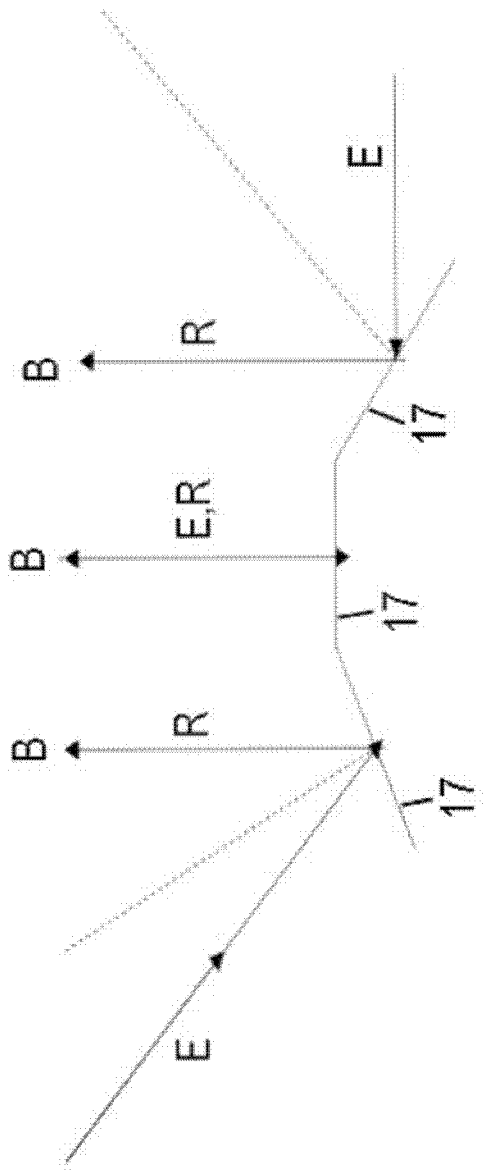

The basic principle of the operation of the inclined segments 17 of the patterned region 15 is illustrated in FIG. 5, wherein, by way of example, the various light paths are depicted for a viewer B who is looking at a right angle to the glass surface or outer surface 11 of the solar module 1. Depicted are three segments 17 with different inclinations relative to the schematically illustrated plane GE of the cover plate 10, as well as the light beams E striking the segments 17, which are reflected to the viewer B by the segments 17 in each case in the glancing angle (reflected light beams R). The center segment 17 is arranged parallel relative to the plane GE of the cover plate 10, with the incident light beam E striking the segments 17 at a right angle and being reflected to the viewer B at a right angle (reflected beam R). In the case of the two adjacent segments 17, the incident light beams E have in each case a non-zero angle relative to the surface normal of the plane GE of the cover plate 10 and likewise strike the viewer B in the glancing angle. Due to the different inclinations of the segments 17, light from different directions is in each case reflected in the local glancing angle of the segments 17 to the viewer B looking at a right angle at the module surface. In the exemplary embodiment of FIG. 5, the angle of incidence and the angle of reflection are f 45° maximum.

Figure 6:
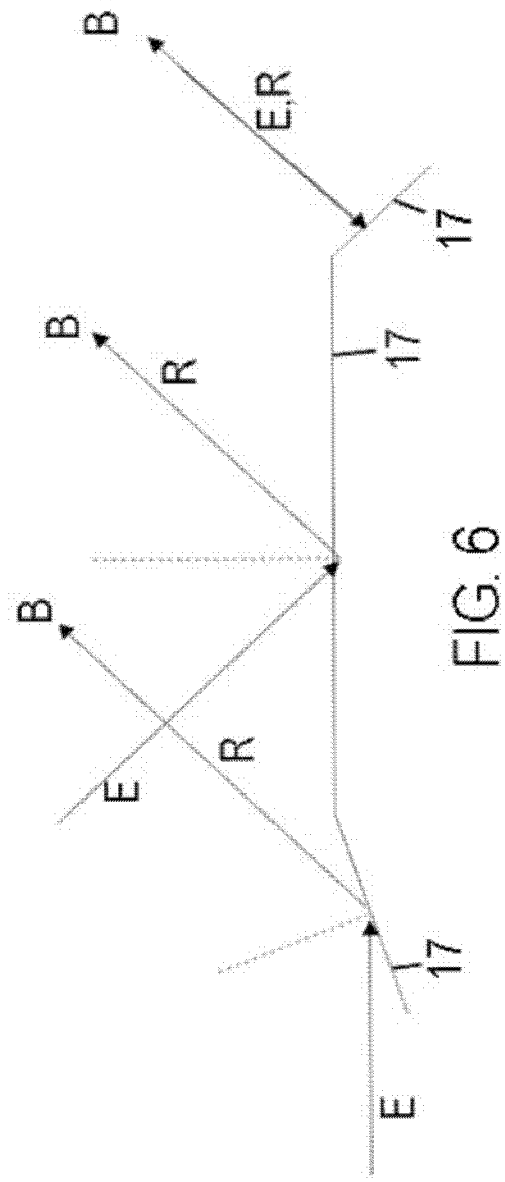

FIG. 6 depicts a situation in which the viewer B is looking at an angle of 45° relative to the surface normal of the plane GE of the cover plate 10. As in FIG. 5, by way of example, three segments 17 with different inclinations relative to the plane GE of the cover plate 10 are depicted, as well as the light beams E incident in each case on the segments 17, which are reflected to the viewer B by the segments 17 in the local glancing angle (reflected light beams R). Due to the different inclinations of the segments 17, light is reflected from different directions in each case in the local glancing angle to the viewer B looking at the module surface. In the exemplary embodiment of FIG. 6, the angles of incidence and reflection are 67.5° maximum. In principle, with relatively large values of the glancing angle, the reflected light is blueshifted. This blue shifting can be reduced by a higher refractive index of the optical interference layer. With relatively steep surface inclinations, multiple reflection on adjacent facets can also occur.

Figure 7:
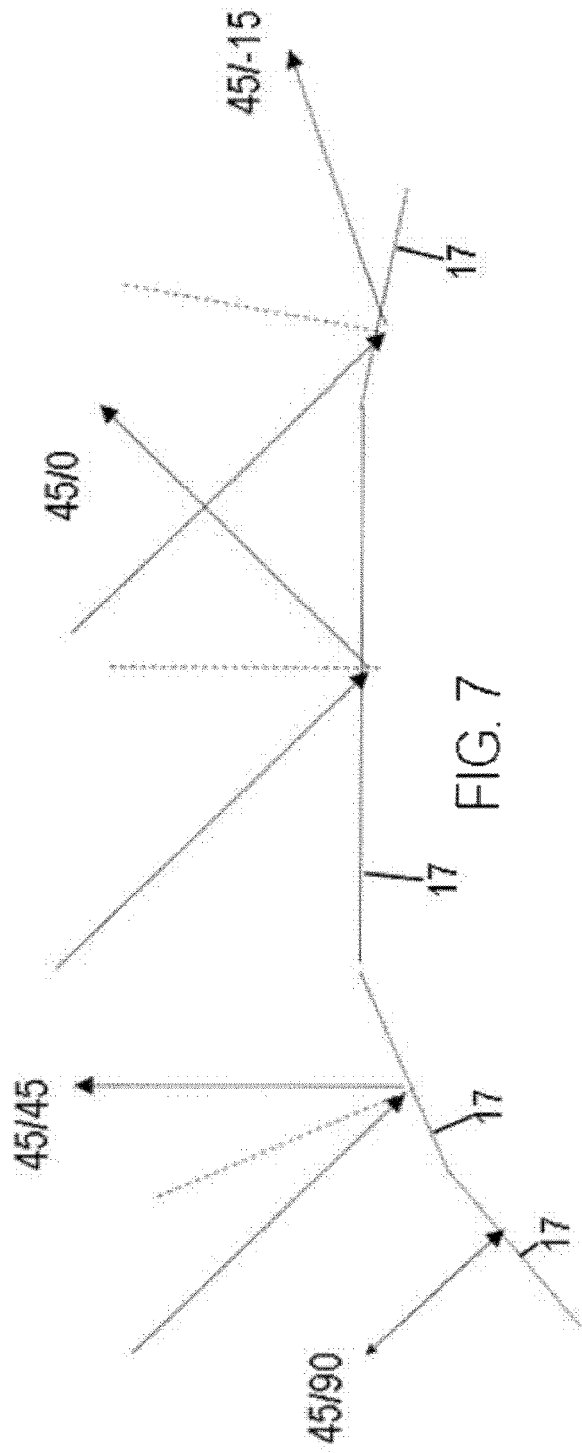

FIG. 7 depicts a situation in which the light source and, correspondingly, the incident light beams are always inclined at an angle of 45° relative to the module surface (plane GE of the cover plate 10). The viewer B observes the module surface at different angles. The angle data in FIG. 7 are to be understood as follows: angle of incidence (relative to the plane GE of the cover plate 10)/viewing angle or reflection angle (deviation of the glancing angle relative to the surface normal of plane GE). The degree sign "°" is not indicated. FIG. 7 depicts, by way of example, four segments 17 with different inclinations relative to the plane GE of the cover plate 10. In only one segment 17, whose plane is parallel relative to the plane GE of the cover plate 10, is the viewer B situated in the glancing angle relative to the plane GE of the cover plate 10: 45/0. This means that the incident light beam has an angle of 45° relative to the plane GE of the cover plate 10; the reflected light beam, an angle deviation zero from the glancing angle. With the other segments 17, the viewer B is situated outside the glancing angle (with reference to the plane GE of the cover plate 10). With the two left segments 17 (45/90, 45/45), the viewer views the module surface at an angle of 90° or 45° relative to the glancing angle, with the light striking at an angle of 45° relative to the plane GE. With the right segment 17 (45/−15), the viewer is situated at an angle of −15° relative to the glancing angle. Due to the differently inclined segments 17 and the local reflection in the glancing angle resulting therefrom (with reference to the plane of the segments 17), light is then reflected to the viewer B with sufficient intensity even when the viewer is not situated in the glancing angle relative to the plane GE of the cover plate 10.

Figure 8:
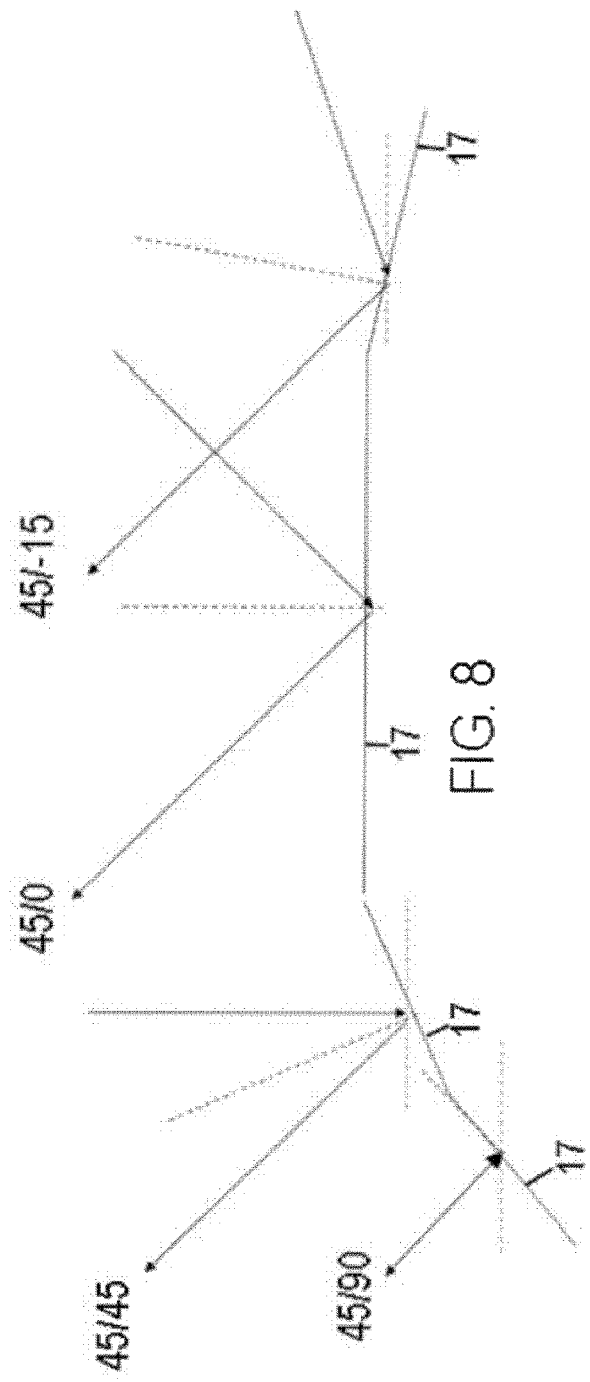

FIG. 8 depicts a situation in which the viewer B always observes the surface of the solar module 1 at an angle of 45° relative to the module surface or plane GE of the cover plate 10. FIG. 8 depicts, by way of example, four segments 17 with different inclinations relative to the plane GE of the cover plate 10. Only in one segment 17, whose plane is parallel relative to the plane GE of the cover plate 10, is the viewer B situated in the glancing angle relative to the plane GE of the cover plate 10: 45/0. With the other segments 17, the viewer B is situated outside the glancing angle (with reference to the plane GE of the cover plate 10). With the two left segments 17 (45/90, 45/45), the viewer B views the module surface at an angle of 45°, with the light striking in a deviation of 90° or 45° relative to the glancing angle (relative to the surface normal of plane GE of the cover plate 10). With the right segment 17 (45/−15), the light strikes at an angle of −15° relative to the glancing angle. Due to the differently inclined segments 17 and the local reflections in the glancing angle resulting therefrom (with reference to the plane of the segments 17), light is then reflected to the viewer B with sufficient intensity even when light strikes outside the glancing angle (with reference to the plane GE of the cover plate 10).

In the solar module 1 according to the invention, a homogeneous color impression in a pre-definable wavelength range can be achieved by means of the patterning of the outer surface 11 of the cover plate 10 in combination with the coloring optical interference layer 16, with the color impression far less angle-dependent in comparison to a non-patterned module surface.

FIG. 9 depicts the optical interference layer 16 with the layer thickness d. The incident light beam E is reflected both at the atmosphere/interference layer interface (R1) and at the interference layer/cover plate interface (R2). If the path difference of the two light beams R1, R2 corresponds to a multiple of the wavelength of the incident light beam, constructive interference occurs; with a path difference of a multiple of the half wavelength, destructive interference occurs. In the case of illumination with white light, the optical interference layer acts as a color filter, since constructive interference, dependent on the refractive index n and the layer thickness d, in accordance with the interference condition $\lambda=4d\,(n^2-\sin^2(\alpha))^{1/2}$, only occurs for light of a suitable wavelength. Here, a is the angle of the reflected beams R1, R2, relative to the surface normal. The light beams R' showed, by way of example, the reflected light outside the glancing angle, which can occur in the patterned region 15, when the roughness of the interference layer/cover plate interface is too great. To satisfy the interference condition, it is necessary for the scattering centers to be, in each case, smaller than the wavelength and the layer thickness. This can be achieved by means of the minimal areas of the segments claimed according to the invention and their maximum roughness. This effect is utilized according to an embodiment of the invention (cf. FIG. 10).

As a result of the coating of the outer surface 11 of the cover plate 10 with an optical interference layer, made of an inorganic, chemically inert, and hard layer, such as with $Si_3N_4$, there is high scratch resistance, chemical stability, and dirt-repellent action for the solar module 1. Climatic tests have also demonstrated that the interference layers made of materials such as $Si_3N_4$ or $TiO_2$ also prevent the corrosion of the glass by moist heat. In addition, a self-cleaning effect can result from the use of photocatalytic layers such as $TiO_2$.

Figure 10:
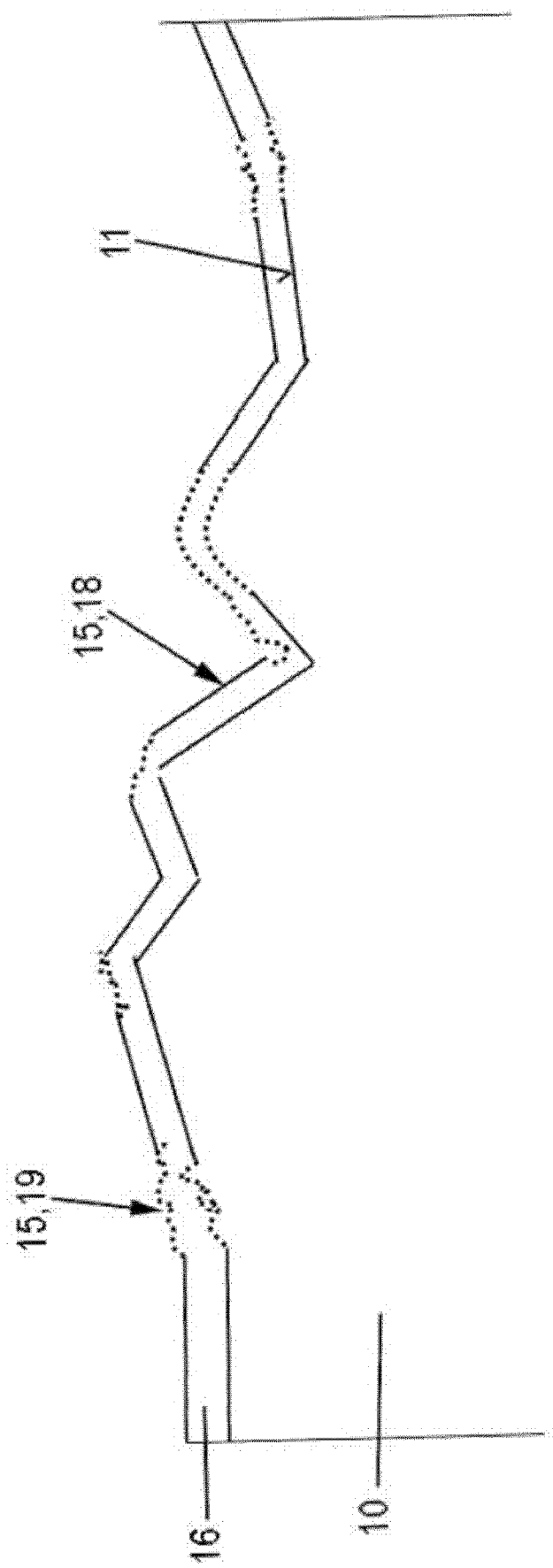

Reference is now made to FIG. 10, wherein another embodiment of the solar module 1 according to the invention is depicted. In order to avoid unnecessary repetitions, only the differences relative to the embodiment of FIGS. 1 and 2 are described; and, otherwise, reference is made to the statements above. In this embodiment, the patterned region 15 of the outer surface 11 has first zones 18 and second zones 19. Here, the first zones 18 are implemented such that the segments have a mean roughness that is less than 15% of the layer thickness d of the optical interference layer 16. In the embodiment of FIG. 2, this is true for the entire patterned region 15. In contrast, the mean roughness in the second zones 19 is great enough that interference is prevented in the optical interference layer 16. For example, the mean roughness of the segments 17 in the second zones 19 is more than 50% of the layer thickness of the optical interference layer 16. The solar module 1 has, consequently, in the first zones 18, a homogeneous color, resulting from the color filtering action of the optical interference layer 16. In the second zones 19, the optical interference layer 16 has, as a result of the lack of constructive interference, no color filtering effect; and thus there is essentially a surface that corresponds to the solar module without an optical interference layer 16. The solar module 1 can thus be optionally provided with a homogeneous color in the pre-definable first zones 18. FIG. 10 depicts the second zones 19 schematically by greater roughness.

Figure 11:
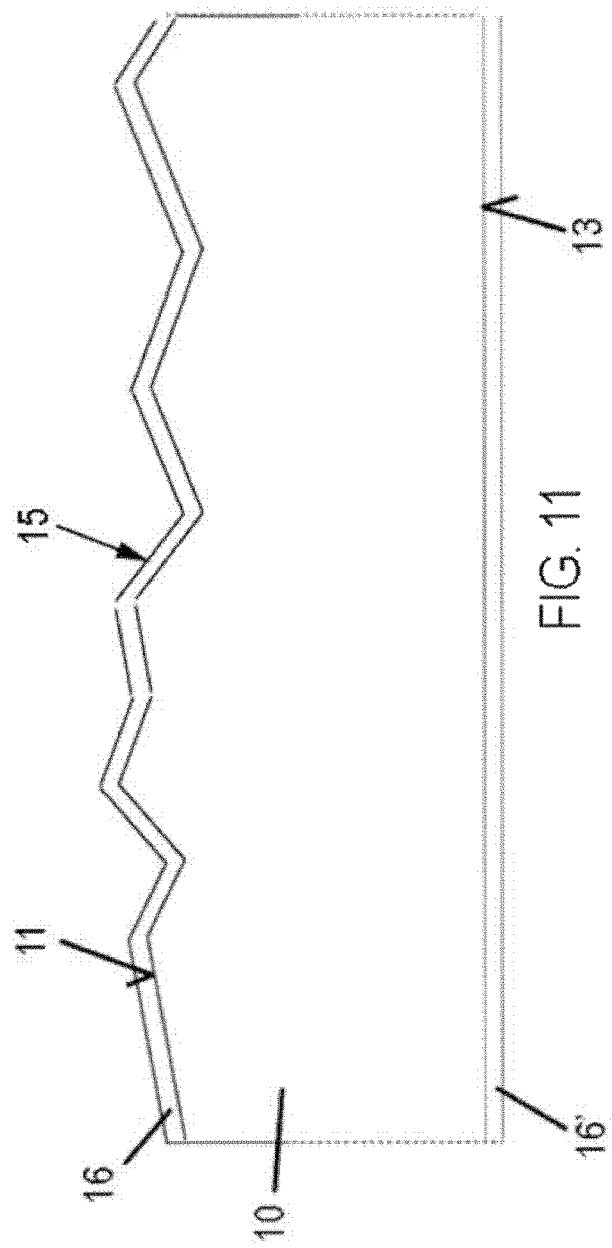

FIG. 11 depicts another embodiment of the solar module 1 according to the invention. In order to avoid unnecessary repetitions, only the differences relative to the embodiment of FIGS. 1 and 2 are described; and, otherwise, reference is made to the statements above. Accordingly, the solar module 1 has a first optical interference layer 16 on the outer surface 11 of the cover plate 10 on the patterned region 15, as well as a second optical interference layer 16' on the inner surface 13 of the cover plate 10. The inner surface 13 of the cover plate 10 is not patterned, i.e., has no patterned region 15 analogous to the outer surface 11. The second optical interference layer 16' has a layer thickness d' and an optical refractive index n', which are the same as those of the first optical interference layer 16; however, the layer thickness and refractive index need not necessarily be the same. As a result of the second optical interference layer 16', the color effect is further strengthened. This yields a second reflexion source with color filtering action since the refractive index of the second optical interference layer between the cover plate 10 (glass) and the adhesive layer 9 is greater than that of the cover plate 10 (glass) and the adhesive layer 9. As a result of the light refraction, the entry angle is smaller with the second reflexion. Since the light passes through an optical interference layer a total of three times, the light that reaches the viewer is more strongly filtered. In particular, the layer thicknesses d, d' and the refractive indices n, n' of the two optical interference layers 16, 16' can also be significantly different from one another. In the case of coating with significantly different optical thicknesses $n*d$ or $n'*d'$, mixed colors can be generated since the first optical interference layer 16 then generates a different reflection spectrum from the second interference layer 16' and the light reflected by 16', upon again passing through the first optical interference layer 16, is overlaid. Thus, colored modules with a variety of colors and high angular stability can be generated in a very simple and economical manner.

Figure 12:
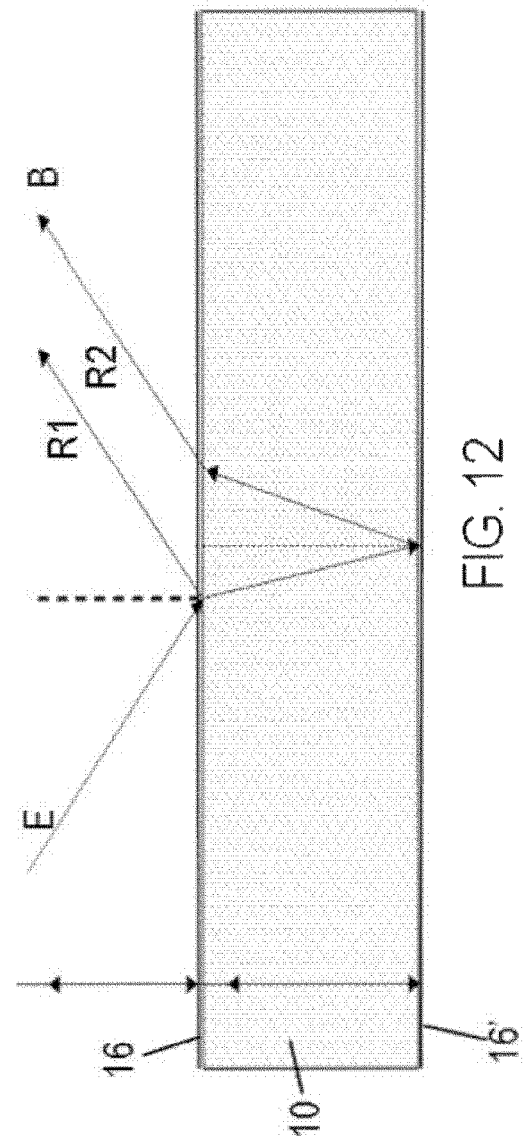

FIG. 12 illustrates, in a highly simplified manner, the beam path of the incident light E and the reflected light R1, R2 with the presence of two optical interference layers 16, 16'. The figure does not show the patterning of the cover plate. Only a single beam path is depicted, here in the glancing angle with reference to the plane of the cover plate. As can be seen, the light that has passed through the first interference layer 16 is refracted in the cover plate 10 (e.g., glass) and is reflected a second time on the second interference layer 16' and is thereby filtered by interference. Upon exiting the cover plate 10, it passes an interference layer a third time.

Figure 13:
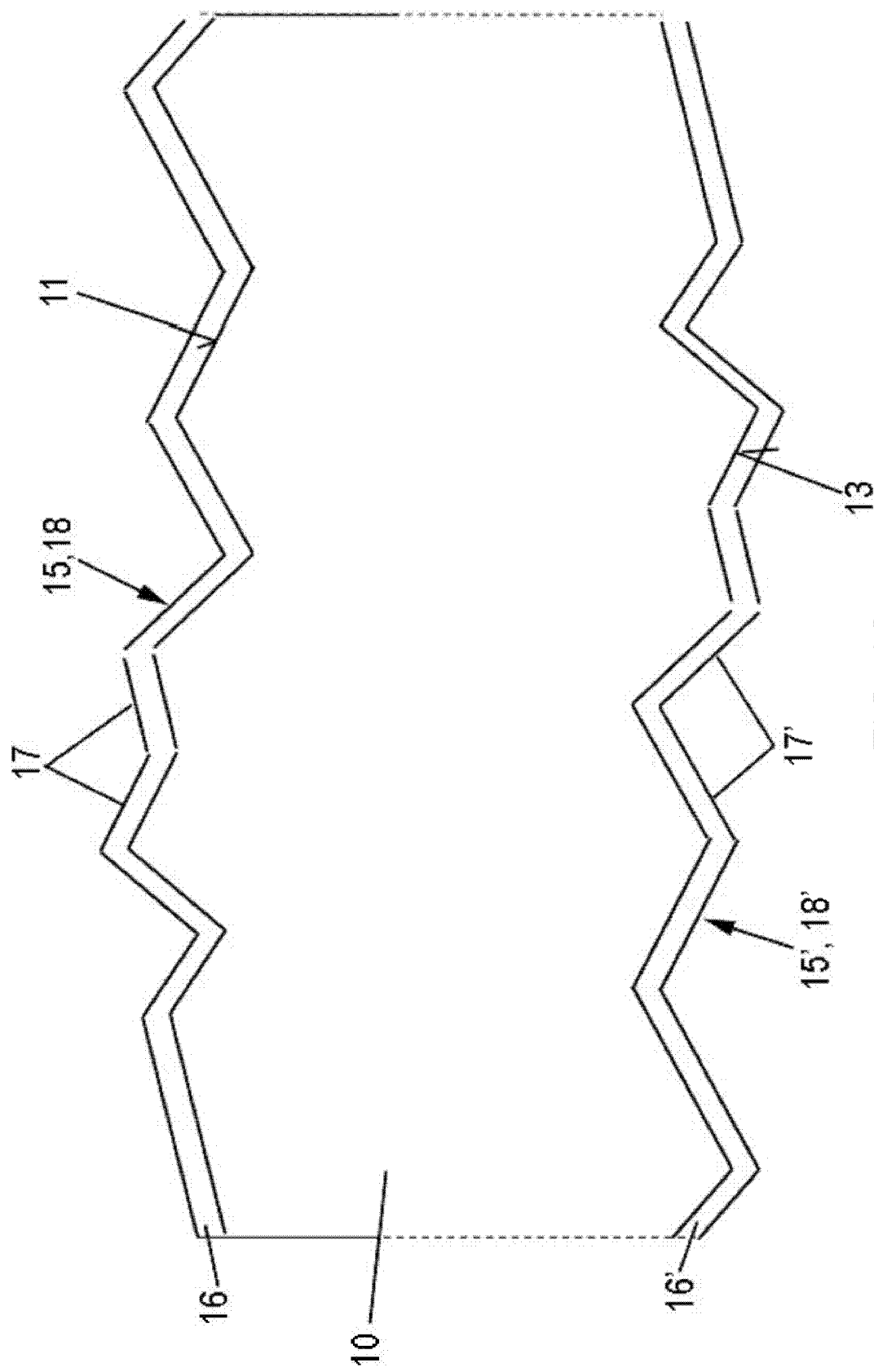

FIG. 13 depicts another embodiment of the solar module 1 according to the invention. In order to avoid unnecessary repetitions, only the differences relative to the embodiment of FIG. 11 are described; and, otherwise, reference is made to the statements above. Accordingly, the solar module has, on the outer surface 11 of the cover plate 10, a first patterned region 15; and on the inner surface 13 of the cover plate 10, a second patterned region 15', wherein a first optical interference layer 16 is arranged on the first patterned region 15 and a second optical interference layer 16' is arranged on the second patterned region 15' (on the solar cell side). The two patterned regions 15, 15' can be implemented analogously. Likewise, the two optical interference layers 16, 16' can be implemented analogously and have the same layer thickness d'=d and the same refractive index n'=n; however, the layer thickness d' and the refractive index n' do not necessarily have to be exactly the same. In particular, the layer thickness d and the refractive index n of the two optical interference layers 16, 16' can also be different from one another. When the same optical thickness $n'*d'$ is selected for the two optical interference layers 16, 16', the color of the solar module 1 can be intensified. In the case of coating with significantly different optical thicknesses, mixed colors can be generated.

Common to the embodiments described in FIGS. 3, 11, and 12 is the fact that already when the light strikes the patterned outer surface with an interference layer, a color with high intensity and little angular dependence develops as a result of reflection and interference even outside the glancing angle. The additional interference layer and/or patterning on the inner surface in the embodiments of FIGS. 11 and 12 can further strengthen this effect.

FIG. 14 depicts the measurement method for multi-angle color measurement, wherein the diffuse scattering of the cover plate 10 not yet coated with the optical interference layer 16, which is implemented here as a glass plate, is measured with a commercially available multi-angle spectrophotometer 21 (x-rite MA-T12). The patterned region 15 extends over the entire outer surface 11 of the cover plate 10. A light beam of a D65 standard illuminant is aimed under various incident angles at the outer surface 11 of the cover plate 10 to be characterized and the scattered or reflected light from various viewing angles, here, for example, 15° or 45° relative to the surface normals of the glass pane is measured spectrally. A black, non-glossy layer 20 (e.g., attached with a liquid with a refractive index of approx. 1.5) is situated under the cover plate 10. With the multi-angle spectrophotometer 21, the brightness in the L-a-b system can be determined with D65 standard illumination and a 10° aperture angle. It has been found that there is good angular stability (low angular dependence of the scattered light), if at both 45° and 15° viewing angles (in each case relative to the normal of the plane of the cover plate) and at an angle of incidence of 45°, measured from the glancing angle (in both directions), there is still at least a brightness of L=10, preferably L=15, and even better L=20. The degree data should be understood as follows: reflection angle (relative to the surface normal/angle of incidence (relative to the glancing angle). For example, with a viewing angle of 45° (measured relative to the surface normal) and an angle of incidence of 45° (measured from the glancing angle), the incident beam strikes exactly perpendicular to the surface (45/45). With a viewing angle of 15° and an angle of incidence of 45°, the incident direction is 30° from the surface normal on the same side as the viewing direction (15/45). The multi-angle spectrophotometer 21 is positioned with a viewing angle of 45° or 15° relative to the surface normal.

FIG. 15 shows a measurement of the brightness L with four different front glasses without a coloring optical interference layer, measured with a multi-angle spectrophotometer 21 as in FIG. 14. On the back side of the front glasses, a matt glass blackened on both sides was optically attached using a thin layer of glycerin (refractive index n=1.47) such that essentially the reflection of the surface is measured. Measured were two satinized glasses a, b with a haze of 94%, a slightly textured solar glass with an antireflection layer c (solar glass, type: Albarino T) with a haze of 2%, as well as an unpatterned float glass d with a haze<0.5%. The angle data correspond to those of FIG. 14, with the exception, that "/" is replaced by "as". The two satinized front glasses a, b have, on the outer surface 11, a patterned region 15 according to the invention; the other two glasses c, d have no such patterned region 15.

Obviously, the two satinized front glasses a, b present overall a significantly higher intensity of the reflected light than the slightly textured solar glass c or the unpatterned float glass d. The float glass d has, essentially, only one reflection in the glancing angle (the glancing angle itself is not measured with this instrument and is, consequently, not shown). In particular, with angles far away from the glancing angle, significant brightness can still be discerned with the two satinized glasses a, b. Precisely this effect is advantageously used according to the present invention in combination with a coloring interference layer. As result of the roughness of the glass, microscopic surfaces with an optimum inclination angle (local glancing angle, entry angle=exit angle) are always available such that the directional dependence of the color and especially of the brightness is significantly less than with coating on an unpatterned glass pane with low haze (e.g., float glass d). The patterned surface according to the invention must in each case have facets and pattern sizes in dimensions greater than the wavelength of visible light. Etched glasses are, for example, suitable for this. The patterns can, however, also be in the submillimeter and millimeter range, for example, rolled glasses. Rolled patterns can also be combined with etched textures. The patterns can also be applied by deposition processes and patterning of a different transparent material onto the cover plate. The patterns should have the most possible different surface inclinations with broad distributions of the inclination angles.

FIG. 16 shows the height profile of the slightly textured glass pane c of FIG. 15 (solar glass, type: Albarino T); FIG. 17, the height profile of the glass pane a more strongly patterned by etching of FIG. 14 (satinized glass). The height profiles were generated from measurements with a confocal microscope.

FIG. 18 shows angular distributions that were generated from the confocal microscopic measurements of FIGS. 16 and 17. Whereas with the slightly patterned glass pane c (solar glass, type: Albarino T), the segments are quite large and inclination angles of only 5-10° occur, the segments of the etched glass pane a (satinized glass) are in the range from 40 µm (hill-to-valley distance in the glass planes) with mean angles of approx. 25°. The angular distribution of the etched glass pane a is very much broader than that of the slightly patterned glass pane c. As can also be seen in FIG. 15, only little intensity of the reflection (measured as an L value) is found with the slightly textured glass pane c at angles greater than 20-30° from the glancing angle. In contrast, with the satinized glass pane a, a still significant brightness is seen at 45/45 or 15/45. FIG. 18 shows the angular distributions of other panes (satinized glass pane b, slightly textured solar glass c' of the type Albarino S, additional glasses e, e').

According to the invention, a clearly detectable intensification of the color effect can be achieved by applying an optical interference layer on the patterned surface of a glass pane. In contrast to this, the color effect is less and there is strong angular dependence when an optical interference layer is applied on the inner surface of an otherwise unpatterned glass pane. In addition, the colors in the case of coating with the optical interference layer on the patterned outer side are stronger than with coating with the optical interference layer on the inner surface of an outer patterned glass pane. In general, a higher refractive index contrast results in stronger reflection and thus in stronger colors. As result of coating the front glass from the outside with the optical interference layer (for example, $Si_3N_4$), the index contrast air/$Si_3N_4$/glass/encapsulation polymer is higher than with the layer sequence air/glass/$Si_3N_4$/encapsulation polymer. With SiC, $ZrO_2$, or $TiO_2$ instead of $Si_3N_4$, the color effect (i.e., the intensity of the reflected colored light) is even higher.

From the regularities for the interference on thin layers, it follows that the angular dependence of the color change is less with a higher refractive index (constructive interference for $\lambda=4*d*(n^2-\sin^2(\alpha))^{1/2}$.

TABLE I

| | Angle | | | | | |
|---|---|---|---|---|---|---|
| | 0 | 45 | 70 | 0 | 45 | 70 |
| Refractive Index n | 2.0 | 2.0 | 2.0 | 2.5 | 2.5 | 2.5 |
| Thickness (nm) | 70 | 70 | 70 | 56 | 56 | 56 |
| Wavelength nm (first max.) | 560 | 524 | 494 | 560 | 537 | 519 |

From the above simple examples of Table I, it becomes clear that with oblique incidence, there is a blueshift of the reflected light and that this blueshift can be reduced by a higher refractive index.

Figure 19:
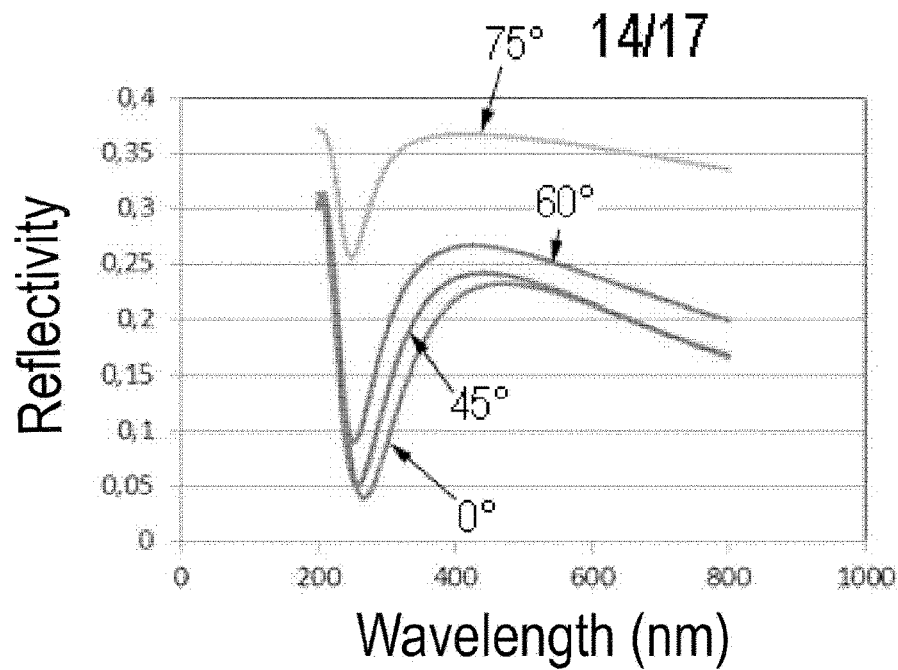

FIG. 19 presents wavelength-dependent reflectivity at various angles. The blueshift is seen again with oblique incidence.

The optical interference layer can be single-ply or multi-ply, with each ply formed by a refraction layer of one and the same material with a homogeneous refractive index. In particular, the optical interference layer can consist of exactly two or exactly three refraction layers. With a three-ply layer as a Bragg filter (Lambda/4 layers), for example, the width of the coloring maxima in the reflection spectrum becomes smaller and the intensity becomes stronger. With a suitable layer combination, red tones can also be produced, which are hardly possible with single layers since the higher orders always introduce too much blue or green. Simulations show that, for example, with a layer combination 65 nm $TiO_2$/115 nm $SiO_2$/65 nm $TiO_2$ on glass, a reflection spectrum with a strong red component is obtained (RGB coordinates (0.81; 0.31; 0.08)). By means of two- and three-ply optical interference layers, a better compromise of transmittance and reflection can also be obtained. Even a colored solar module should have the highest possible efficiency. The maximum of solar radiation is in the green spectral range. By means of two- and three-ply layers, the spectral range of the reflected light can be narrowed, and there are more degrees of freedom for finding the right color shade.

The following Table II shows, for example, some layer combinations and their properties. Here, through simulation, a layer combination was sought that best suits a specific strong darker blue tone (L=37, a=22, b=−60). For all layer systems, the color distance dE was calculated from this color value. Furthermore, the resulting transmittance spectrum was weighted with the solar spectrum and the transmittance calculated. Then, from that, the transmittance loss resulting from the layer system was calculated. Essential to the invention is the angular stability of the optical interference layer. By means of combination of a multi-ply interference layer with a patterned glass pane, high angular stability and high color intensity of the coated glass element can be obtained. Consequently, the difference in the color value between 20° and 50° irradiation was also calculated for the simulated layer package (on a smooth substrate). The simulations on smooth glass serve as reference points for the coating on patterned glass. With patterned glass, the viewer then sees the sum of the reflections from different angles. If a layer package has more angular stability and more color intensity on smooth glass, that also holds true on the patterned glass. The angular stability of brightness and saturation is, however, far better on patterned glass.

TABLE II

| Layer Package | Transmittance Loss (%) | dE 20°-50° | dE to Target |
|---|---|---|---|
| $Si_3N_4$ 149 nm/glass | 9 | 9 | 34 |
| $TiO_2$ 15 nm/glass | 7 | 2 | 51 |
| $TiO_2$ 115 nm/glass | 21 | 9 | 11 |
| $SiO_2$ 16 nm/$TiO_2$ 111 nm/glass | 20 | 10 | 11 |
| $Si_3N_4$ 95 nm/$TiO_2$ 36 nm/glass | 12 | 15 | 11 |
| $SiO_2$ 138 nm/$TiO_2$ 24 nm/glass | 4 | 14 | 19 |
| $TiO_2$ 32 nm/$Si_3N_4$ 67 nm/$TiO_2$ 21 nm/glass | 15 | 12 | 7 |
| $TiO_2$ 23 nm/$Si_3N_4$ 75 nm/$TiO_2$ 22 nm/glass | 9 | 13 | 8 |

By means of three-ply layers, almost white solar modules can be produced which nevertheless present electrical power since the transmittance in the direction of the solar cells in the visible range is still 10-20% and still above 90% in the near infrared.

Figure 20:
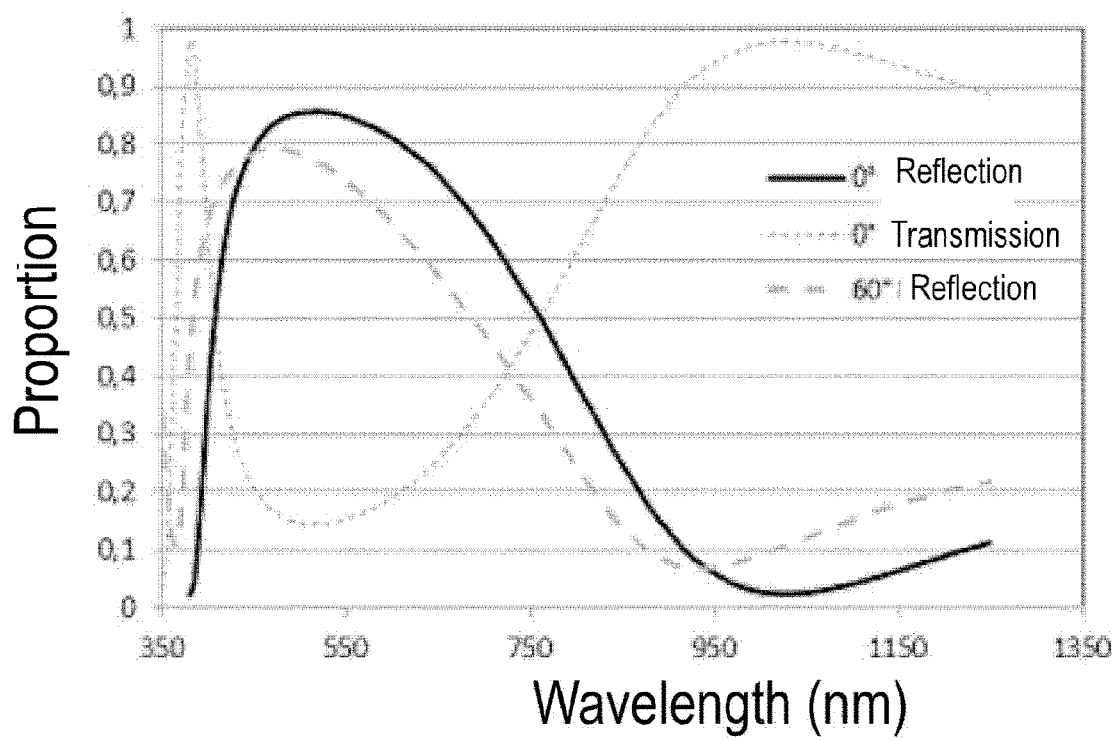

FIG. 20 shows simulated spectra of a layer system consisting of 45 nm $TiO_2$/90 nm $Si_3N_4$/45 nm $TiO_2$. The color coefficients of the reflection spectrum of this layer package can be calculated in RGB coordinates (0.8; 0.86; 0.76). This corresponds to a slightly gray-tinted white. With oblique incidence (60°), the blue component increases somewhat. However, the overall impression remains relatively color neutral at RGB=(0.66; 0.81; 0.84).

Already, simply through the use of 2-ply optical interference layers, the brightness and saturation of the color shade can thus be improved and the transmittance can be simultaneously optimized. Preferably, the optical interference layer is made of exactly two plies of two different materials with a different refractive index n1, n2. The following applies for the amounts of the differences in the refractive indices: $|n1-n_d|>0.3$ and $|n2-n1|>0.3$, and at least one of the refractive indices n1 or n2 is greater than 1.9, preferably greater than 2.3, where $n_d$ is the refractive index of the cover plate.

The use of 3-ply optical interference layers allows even more colors and further optimization from color shade, angular dependence, and transmittance. An optical interference layer of exactly three plies (refraction layers) can be made of two or three different materials with refractive indices n1, n2, n3, wherein the following applies: $|n3-n2|>0.3$ and $|n2-n1|>0.3$ and $|n1-n_d|>0.3$. The values of the refractive indices behave alternatingly; i.e., either n1>n2 and n3>n2 or n1<n2 and n3<n2. In addition, at least one of the refractive indices n1, n2, or n3 is greater than 1.9, preferably greater than 2.3. Possible materials for the lower refractive indices are, for example, $SiO_2$, SiON, $Al_2O_3$, and $MgF_2$. The combination with a patterned cover plate already enables high values for brightness and saturation with 1 or 2 or a maximum of 3 plies.

Results of the technical implementation of the invention in various embodiments are described in the following:

CIGS thin-film solar modules were produced. Instead of a customary front glass, coated and patterned front glasses were used. Standard front glasses have an antireflection layer and are only slightly patterned (haze=2%). Chemically etched, i.e., satinized, glasses were used as the patterned or textured glasses. The glasses had a haze of 94%. Microscopic analyses showed surface patterns with a pattern size of 20-40 µm and pattern heights of 15 µm. FIG. 17 shows the confocal microscope image of the surface of the satinized glasses used. The angles of the surface patterns (angles relative to the plane of the glass) were rather flat with typical angles around 20-40°. For the comparison, a commercially available front glass with a multi-ply interference layer on the inner side was used.

The glasses were coated on the patterned side with a single layer of silicon nitride ($Si_3N_4$) using magnetron sputtering. Then, they were laminated to the CIGS thin-film circuit with the coated and patterned side outward (i.e., the side facing the sun). In a second experiment, the smooth inner side was also additionally coated with a silicon nitride layer. Used as a reference was a commercially available front glass that is coated on the inside with a multi-ply layer made of various materials with different refractive indices.

Subsequently, the modules were characterized using a multi-angle spectrophotometer and color values in Lhc coordinates were evaluated (L=brightness, C=chromaticity or saturation, and H=hue or color shade). The multi-angle spectrophotometer has two viewing angles and 6 illumination angles in each case. The illumination angles are referenced to the glancing angle. In each case, measurements were not made in the glancing angles.

Figure 21:
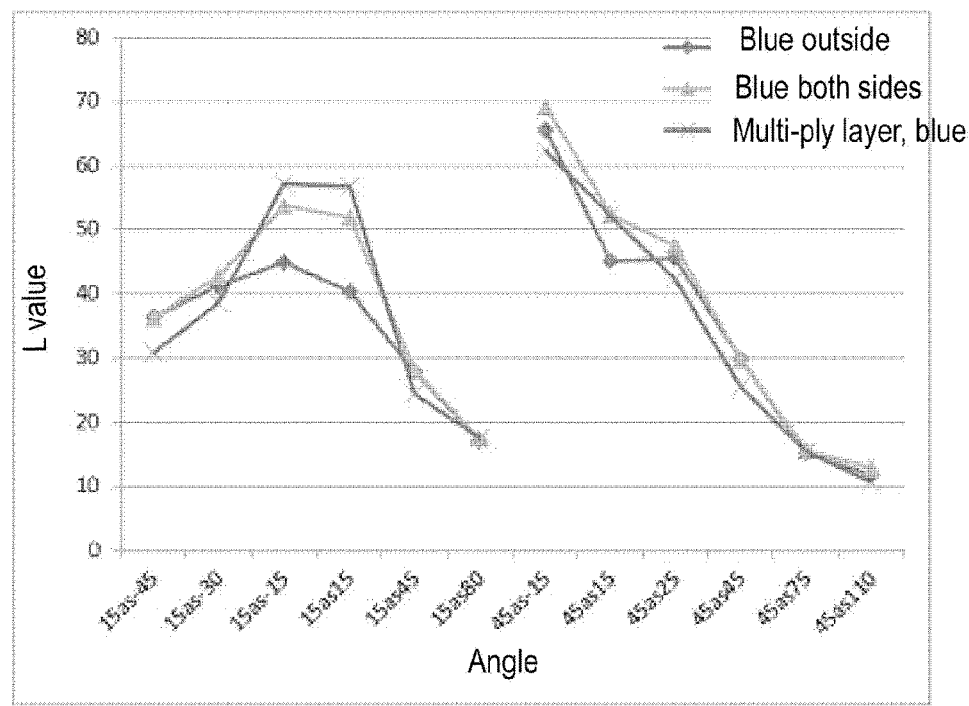
Figure 22:
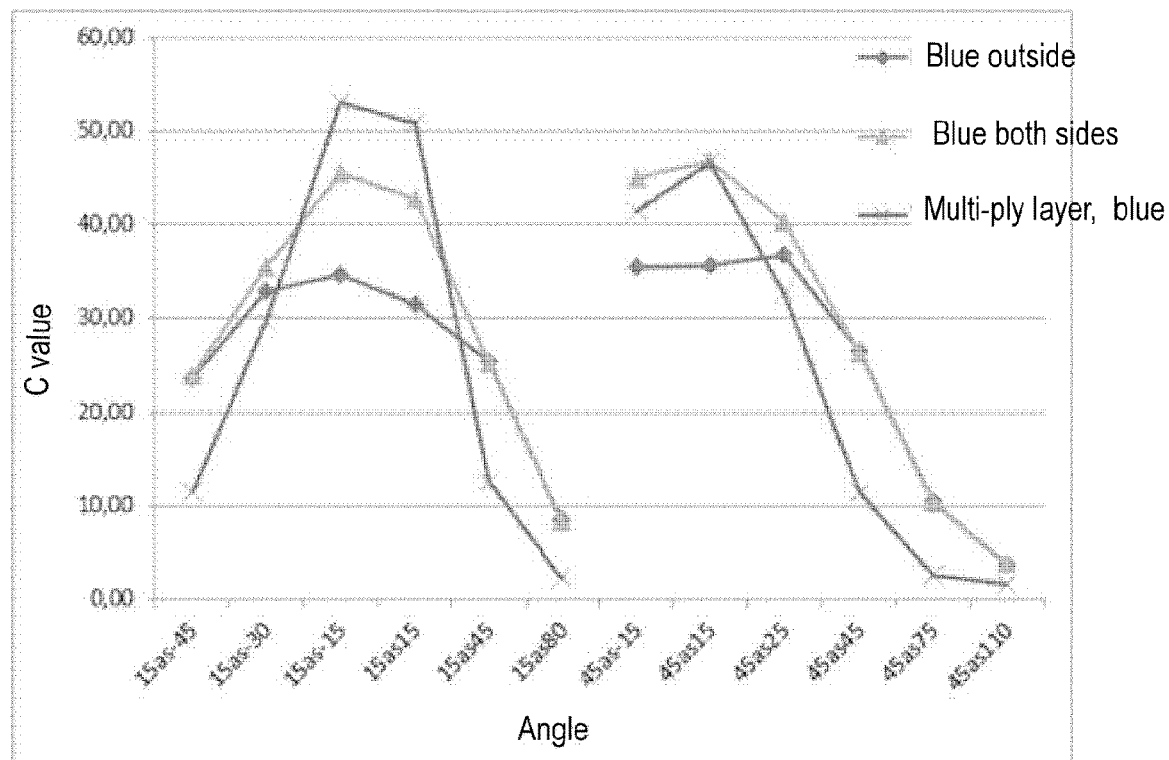
Figure 23:
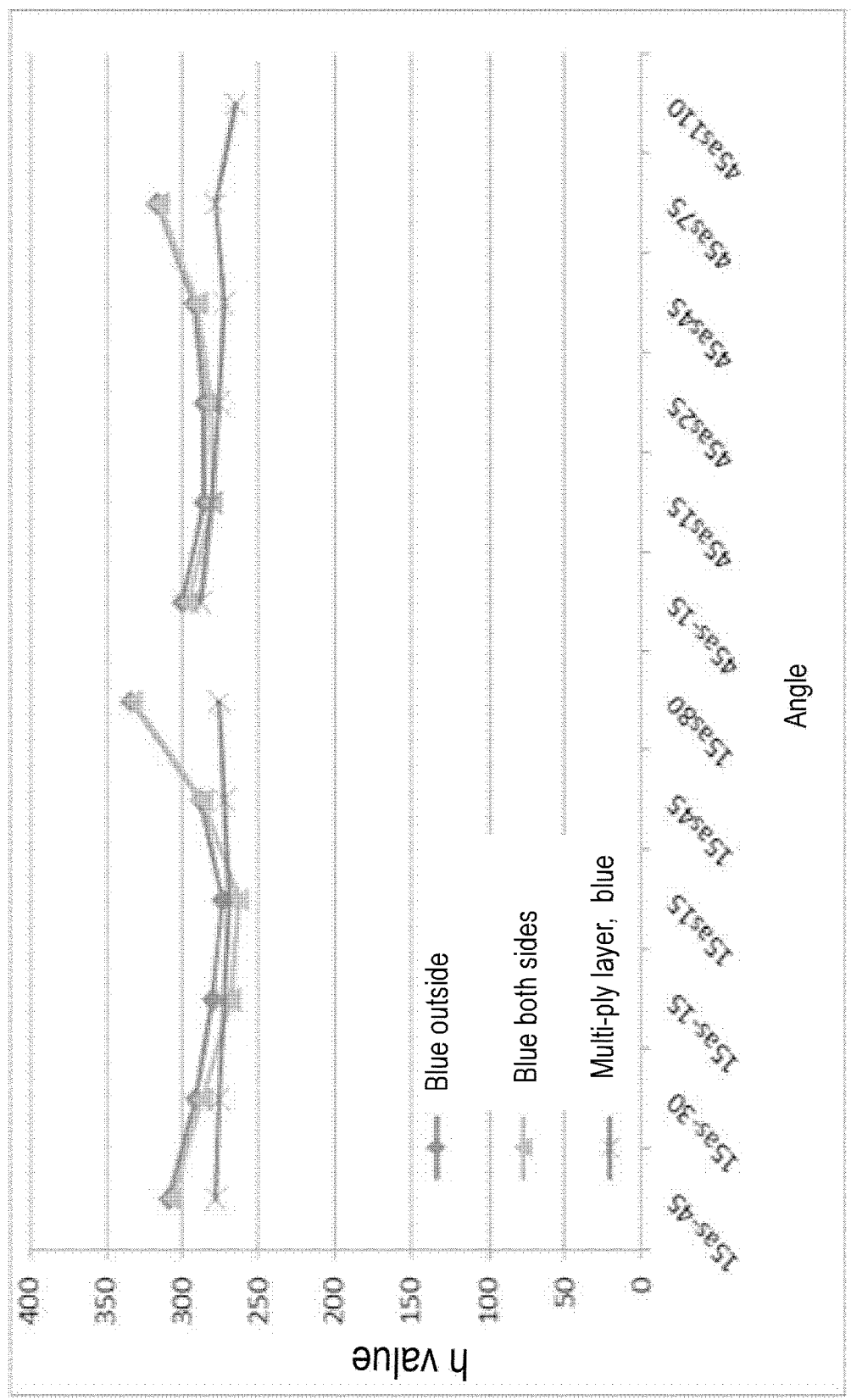

FIGS. 21 to 23 show the results for L, h, and c for coating on the outside, on both sides, and with the multi-ply layer system (inside). The axis designation "15as45" refers to, analogously with the previous notation, a detection angle of 15° and an illumination angle of 45° from the glancing angle in the direction of the viewing direction, in other words, the angle between the illumination direction and the viewing direction is smaller than the glancing angle; "15as−45" means 45° behind the glancing angle, in other words, the angle between the illumination direction and the viewing direction is larger than the glancing angle.

It is found that the brightness L for the coating on the outside is, to be sure, somewhat lower but more stable. The brightness L of the coating on both sides comes very close to that of the multi-ply layer. There is a similar result in color saturation as well: the saturation with the coating on the outside is somewhat weaker but very stable. The angular dependence of the color shade is yet somewhat stronger with the coatings according to the invention. At larger angles, a slight blueshift is seen. It is possible to reduce this by using a material with a higher refractive index (TiOx, SiC).

In a further experiment, single layers of $Si_3N_4$ or titanium dioxide were coated onto various glasses, and the glasses were incorporated into modules in various configurations. The modules were measured with a spectrophotometer that illuminates the surface diffusely (light type D65) and measures the color at an angle of 8° relative to the surface normal. The illumination in the glancing angle can be included (SCI) or excluded (SCE). The color values were calculated in Lab coordinates and the chromaticity (saturation) and color tone were also determined therefrom.

TABLE III

| Color | Material | Layer Thickness | Position | L | c | h |
|---|---|---|---|---|---|---|
| gray | Si3N4 | 26 | outside | 36 | 7 | N/A |
| blue | Si3N4 | 161 | outside | 33 | 25 | 284 |
| blue/violet | TiO2 | 125 | outside | 40 | 37 | 294 |
| green | TiO2 | 230 | outside | 40 | 32 | 170 |
| gold | Si3N4 | 236 | outside | 50 | 22 | 108 |
| gold | TiO2 | 80 | outside | 60 | 26 | 90 |

Table III shows that already with single-ply layers, saturated colors and bright color tones are obtained. The layer thicknesses were in the range from 20 nm-300 nm. As expected, with titanium dioxide, it was possible to produce even brighter and more strongly saturated color tones. With very thin layers, even gray tones can be produced.

Also determined was the difference between the color with inclusion of the glancing angle and with the exclusion of the glancing angle in the color difference dE(2000). This measurement method also gives an evaluation of angular stability.

The results with the blue tone example are presented below in Table IV. There is already a very small dE(2000) value for a single layer of $Si_3N_4$ on glass satinized on one side. When this configuration is supplemented with another layer of $Si_3N_4$ on the inside, the brightness and the color saturation increase with only a slight increase in dE. When $TiO_2$ is coated on the outside on the glass satinized on one side, the brightness and color saturation increase compared to the prior configurations with extremely low dE. As a reference, $TiO_2$ was coated onto the smooth side of a pane satinized on one side and laminated to form a module with the coating toward the outside. Since the glass and the lamination film differ only slightly in refractive index, the satinized side now has hardly any influence. In this case, with the inclusion of glancing, good brightness and saturation are obtained; however, with the exclusion of glancing, the color effect disappears completely with greatly reduced brightness and saturation, in other words, dE of SCI versus SCE is quite large.

As evidence of the optimization of color and performance with unchanged angular stability, a three-ply layer $TiO_2$ (27 nm)/$Si_3N_4$ (100 nm)/$TiO_2$ (18 nm) was coated onto a satinized cover glass with the structural properties described. In comparison thereto, a single layer $TiO_2$ (125 nm) was deposited onto another cover glass. The two glasses were further processed to form CIGS thin-film modules. Both blue modules had a brightness of L=41 and a saturation of c=36; performance loss of the module with the single-ply layer was 25%, whereas the module with the three-ply layer had lost only 15% of performance.

A preferred embodiment of this invention is the coating of a material with a high refractive index onto a textured glass pane and integration into the module with a coated and textured side on the outside. Coating on both sides is also advantageous. The brightness and saturation could be further increased by coating on both sides of glass satinized on both sides. One-sided coating on the outside with three-ply layers on patterned glass with the above stated properties resulted in photovoltaic modules for building integration with colors of high saturation, good angular stability, optimized performance.

TABLE IV

| Description | Coating | Configuration | Glancing | L* (D65) | a* (D65) | b* (D65) | c | h | dE 2000 |
|---|---|---|---|---|---|---|---|---|---|
| satinized glass one side | $Si_3N_4$ | texture outside, coating outside | SCI | 33.0 | 6.1 | −24.2 | 25.0 | 284 | 0.5 |
| satinized glass one side | $Si_3N_4$ | texture outside, coating outside | SCE | 32.6 | 6.3 | −24.0 | 24.8 | 285 | |
| satinized glass one side | $Si_3N_4$ | texture outside, coating both sides | SCI | 36.7 | 2.9 | −28.3 | 28.4 | 276 | 1.7 |
| satinized glass one side | $Si_3N_4$ | texture outside, coating both sides | SCE | 35.4 | 4.0 | −27.4 | 27.7 | 278 | |
| satinized glass one side | $TiO_2$ | texture outside, coating outside | SCI | 40.4 | 15.0 | −34.2 | 37.3 | 294 | 0.5 |
| satinized glass one side | $TiO_2$ | texture outside, coating outside | SCE | 40.1 | 15.4 | −33.9 | 37.2 | 295 | |
| satinized glass one side | $TiO_2$ | texture inside, coating outside | SCI | 41.5 | 1.4 | −43.5 | 43.6 | 272 | 35.6 |
| satinized glass one side | $TiO_2$ | texture inside, coating outside | SCE | 7.7 | 0.9 | 3.8 | 3.9 | | |
| Multi-ply | no data | coating inside | SCI | 37.0 | −0.2 | −27.9 | 27.9 | 270 | 2.1 |
| Multi-ply | no data | coating inside | SCE | 34.9 | 0.0 | −25.3 | 25.3 | 270 | |

FIG. 24 illustrates the method according to the invention for producing the solar module according to the invention 1, wherein only the steps for processing the cover plate are described.

Here, in a first step a) a planar transparent cover plate is provided, which has an outer surface that is intended to face the external environment and an opposite inner surface. Then, a single second step b1), b2) or b3) is selected from the following three (alternative) steps and carried out:

b1) Patterning the outer surface at least in one region and applying an optical interference layer on the patterned region. In this case, the inner surface is not patterned and no optical interference layer is applied on the inner surface.

b2) Patterning the outer surface at least in one region, applying an optical interference layer on the patterned region of the outer surface, and applying another optical interference layer on the inner surface. In this case, the inner surface is not patterned.

b3) Patterning the outer surface at least in one region, applying an optical interference layer on the patterned region of the outer surface, patterning the inner surface at least in one region, and applying another optical interference layer on the patterned region of the inner surface.

The invention makes available an improved solar module as well as a method for production thereof that has a very homogeneous, intense color with little or no directional dependence. Through the use of optical interference for color generation, significantly less efficiency loss is obtained for the underlying solar module than with the use of opaque coloring layers. This invention enables a very simple and economical method for producing colored solar modules with high efficiency and high resistance.

LIST OF REFERENCE CHARACTERS 1 solar module
2 substrate
3 layer structure
4 sunlight
5 back electrode layer
6 absorber layer
7 buffer layer
8 front electrode layer
9 adhesive layer
10 cover plate
11 outer surface
12 solar cell
13 inner surface
14 back of the module
15, 15' patterned region
16, 16' optical interference layer
17, 17' segment
18, 18' first zone
19 second zone
20 black layer
21 multi-angle spectrophotometer

The invention claimed is:

1. A solar module for photovoltaic energy generation, comprising:
a transparent cover plate with an outer surface facing an external environment and an opposite inner surface, wherein:
the outer surface has at least one patterned region, at least one optical interference layer for reflecting light within a predefined wavelength range is directly arranged on the outer surface, wherein a thickness of the at least one optical interference layer is 0.1-2 μm;
the at least one patterned region has the following features:
perpendicularly to a plane of the cover plate, a height profile with hills and valleys, wherein a mean height difference between the hills and valleys is at least 2 μm and the mean height difference between the hills and valleys is a maximum of 20% of a thickness of the transparent cover plate, and
at least 50% of the patterned region is composed of segments that are inclined relative to the plane of the cover plate, wherein, with reference to the plane of the cover plate, at least 20% of the segments have an inclination angle in a range from greater than 0° to 15°, and at least 30% of the segments have an inclination angle in a range from greater than 15° to 45°;
the at least one patterned region being non-periodic and anisotropic;
the segments are flat and have a segment area of at least 1 μm$^2$, the segments having each a mean roughness of less than 15% of the thickness of the at least one optical interference layer on the outer surface, and
wherein the transparent cover plate is configured such that, in response to the transparent cover plate being provided with a black inner surface and illuminated on an illuminated surface opposite the black inner surface at an angle of incidence that deviates by 45° from a glancing angle of the illuminated surface, a brightness L of a reflected light with a color effect is observed at viewing angles of 45° and 15°, wherein the viewing angles are based on a normal relative to the cover plate, L being selected from the group consisting of at least 10, at least 15, and at least 20, and
wherein the at least one optical interference layer is a single-ply optical interference layer such that a bright color tone of the solar module is obtained.

2. The solar module according to claim 1, wherein the inner surface has no patterned region and no optical interference layer.

3. The solar module according to claim 1, wherein the inner surface has no patterned region, and
another optical interference layer for reflecting light within a predefined wavelength range is arranged on the inner surface.

4. The solar module according to claim 1, wherein the inner surface has at least one patterned region, on which an optical interference layer for reflecting light within a predefined wavelength range is arranged.

5. The solar module according to claim 1, wherein the at least one optical interference layer includes a single refraction layer having a refractive index n selected from the group consisting of greater than 1.7, greater than 2.0, and greater than 2.3.

6. The solar module according to claim 1, wherein the at least one optical interference layer includes exactly two refraction layers, and wherein
a first refraction layer with a first refractive index n1 is arranged on the transparent cover plate with a refractive index nd with |n1−nd|>0.3,
a second refraction layer with a second refractive index n2 is arranged on the first refraction layer with |n2−n1|>0.3, and
at least one of the refractive indices n1 and n2 is greater than 1.9 or greater than 2.3.

7. The solar module according to claim 1, wherein the at least one optical interference layer includes exactly three refraction layers, wherein
a first refraction layer with a first refractive index n1 is arranged on the transparent cover plate with a refractive index nd with |n1−nd|>0.3,
a second refraction layer with a second refractive index n2 is arranged on the first refraction layer with |n2−n1|>0.3, and |n1−nd|>0.3,
a third refraction layer with a third refractive index n3 is arranged on the second refraction layer with |n3−n2|>0.3,
at least one of the refractive indices n1, n2, or n3 is greater than 1.9 or greater than 2.3, and
(i) n1>n2 and n3>n2, or (ii) n1<n2 and n3<n2.

8. The solar module according to claim 1, wherein at least 80% of a patterned region is composed of segments inclined relative to the plane of the cover plate.

9. The solar module according to claim 1, wherein
i) at least 30% of the segments have an inclination angle in a range from greater than 0° to 15°, at least 40% of the segments have an inclination angle in a range from greater than 15° to 45°, and less than 10% of the segments have an inclination angle greater than 45°, or
ii) at least 40% of the segments have an inclination angle in a range from great7er than 0° to 15°, at least 50% of the segments have an inclination angle in a range from greater than 15° to 45°, and less than 10% of the segments have an inclination angle greater than 45°.

10. The solar module according to claim 1, wherein the at least one optical interference layer contains at least one compound selected from the group consisting of $TiO_x$, $ZrO_x$, SiC, and $Si_3N_4$.

11. The solar module according to claim 1, wherein the at least one optical interference layer contains at least one compound selected from the group consisting of $MgF_2$, $Al_2O_3$, $SiO_2$, and silicon oxynitride.

12. The solar module according to claim 1, wherein the cover plate has a reflection haze of more than 50% or more than 90%.

13. The solar module according to claim 1, wherein the mean height difference between the hills and valleys is at least 50 µm or at least 100 µm.

14. A method for producing a solar module, the method comprising:
 a) providing a transparent cover plate with an outer surface, adapted to face an external environment, and an opposite inner surface; and
 b) performing b1), b2) or b3) being:
 b1) patterning the outer surface at least in one region, and applying an optical interference layer on the patterned region,
 b2) patterning the outer surface at least in one region, applying an optical interference layer on the patterned region, and applying another optical interference layer on the inner surface,
 b3) patterning the outer surface at least in one region, applying an optical interference layer on the patterned region, patterning the inner surface at least in one region, and applying another optical interference layer on the patterned region of the inner surface,
 wherein the optical interference layer is for reflecting light within a predefined wavelength range and is directly arranged on the outer surface, wherein a thickness of the optical interference layer on the outer surface is 0.1-2 µm;
 the at least one patterned region has the following features:
 perpendicularly to a plane of the cover plate, a height profile with hills and valleys, wherein a mean height difference between the hills and valleys is at least 2 µm and the mean height difference between the hills and valleys is a maximum of 20% of a thickness of the transparent cover plate, and
 at least 50% of the patterned region is composed of segments that are inclined relative to the plane of the cover plate, wherein, with reference to the plane of the cover plate, at least 20% of the segments have an inclination angle in a range from greater than 0° to 15°, and at least 30% of the segments have an inclination angle in a range from greater than 15° to 45°; and
 the at least one patterned region being non-periodic and anisotropic;
 wherein the segments are flat and have a segment area of at least 1 µm2, the segments having each a mean roughness of less than 15% of the layer thickness of the optical interference layer on the outer surface; and
 wherein the transparent cover plate is configured such that, in response to being provided with a black inner surface and illuminated on an illuminated surface opposite the black inner surface at an angle of incidence that deviates by 45° from a glancing angle of the illuminated surface, a brightness L of a reflected light is observed at viewing angles of 45° and 15, wherein the viewing angles are based on a normal relative to the cover plate, L being selected from the group consisting of at least 10, at least 15, and at least 20,
 wherein the optical interference layer on the outer surface is a single-ply optical interference layer such that a bright color tone of the solar module is obtained.

15. A building envelope or a freestanding wall having an integrated component, the integrated component comprising the solar module according to claim 1.

16. The building envelope or freestanding wall of claim 15, wherein the integrated component is selected from the group consisting of a window, a facade, and a roof element.

* * * * *